(12) United States Patent
Miyanaga et al.

(10) Patent No.: US 8,779,418 B2
(45) Date of Patent: Jul. 15, 2014

(54) SEMICONDUCTOR DEVICE AND METHOD FOR MANUFACTURING THE SAME

(75) Inventors: Akiharu Miyanaga, Kanagawa (JP); Junichiro Sakata, Kanagawa (JP); Masayuki Sakakura, Tochigi (JP); Masahiro Takahashi, Kanagawa (JP); Hideyuki Kishida, Kanagawa (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 371 days.

(21) Appl. No.: 12/900,136

(22) Filed: Oct. 7, 2010

(65) Prior Publication Data

US 2011/0084272 A1 Apr. 14, 2011

(30) Foreign Application Priority Data

Oct. 9, 2009 (JP) .................................. 2009-235570

(51) Int. Cl.
*H01L 29/12* (2006.01)
(52) U.S. Cl.
USPC .................... 257/43; 257/57; 257/60; 257/72; 257/E33.002; 257/E27.116
(58) Field of Classification Search
CPC ...................... H01L 29/7869; H01L 29/78618; H01L 27/1214; H01L 27/1222
USPC .................... 257/43, 57–60, 66, 72, E33.002, 257/E33.043, E31.003, E27.116
See application file for complete search history.

(56) References Cited

U.S. PATENT DOCUMENTS

| 5,731,856 | A | 3/1998 | Kim et al. |
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |

(Continued)

FOREIGN PATENT DOCUMENTS

| EP | 1 737 044 A1 | 12/2006 |
| EP | 2219225 A1 | 8/2010 |

(Continued)

OTHER PUBLICATIONS

International Search Report, PCT Application No. PCT/JP2010/066747, dated Dec. 7, 2010, 2 pages.

(Continued)

*Primary Examiner* — Matthew E Warren
(74) *Attorney, Agent, or Firm* — Fish & Richardson P.C.

(57) ABSTRACT

An object is to provide a thin film transistor having favorable electric characteristics and a semiconductor device including the thin film transistor as a switching element. The thin film transistor includes a gate electrode formed over an insulating surface, a gate insulating film over the gate electrode, an oxide semiconductor film which overlaps with the gate electrode over the gate insulating film and which includes a layer where the concentration of one or a plurality of metals contained in the oxide semiconductor is higher than that in other regions, a pair of metal oxide films formed over the oxide semiconductor film and in contact with the layer, and a source electrode and a drain electrode in contact with the metal oxide films. The metal oxide films are formed by oxidation of a metal contained in the source electrode and the drain electrode.

22 Claims, 29 Drawing Sheets

(56) References Cited

U.S. PATENT DOCUMENTS

| | | | |
|---|---|---|---|
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,960,289 B2 | 6/2011 | Chang | |
| 8,168,544 B2 | 5/2012 | Chang | |
| 8,212,248 B2 | 7/2012 | Itagaki et al. | |
| 8,304,773 B2 | 11/2012 | Shimada | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0197350 A1 | 8/2008 | Park et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1* | 12/2008 | Ryu et al. | 257/43 |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0025677 A1* | 2/2010 | Yamazaki et al. | 257/43 |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0224873 A1 | 9/2010 | Sakata et al. | |

FOREIGN PATENT DOCUMENTS

| | | |
|---|---|---|
| EP | 2 226 847 A2 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-96055 A | 4/2007 |
| JP | 2007-123861 A | 5/2007 |
| JP | 2008041695 A | 2/2008 |
| JP | 2008141113 A | 6/2008 |
| JP | 2008-205469 A | 9/2008 |
| JP | 2009-123957 A | 6/2009 |
| JP | 2009164393 A | 7/2009 |
| JP | 2010-232647 A | 10/2010 |
| JP | 2011100982 A | 5/2011 |
| WO | 2004/114391 A1 | 12/2004 |
| WO | WO2008015944 A1 | 2/2008 |
| WO | WO2008069057 A2 | 6/2008 |
| WO | WO2009072533 A1 | 6/2009 |
| WO | WO2009/087943 A1 | 7/2009 |
| WO | WO2011/043218 A1 | 4/2011 |

OTHER PUBLICATIONS

Written Opinion, PCT Application No. PCT/JP2010/066747, dated Dec. 7, 2010, 5 pages.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26. pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

(56) References Cited

OTHER PUBLICATIONS

Cho, D et al., "21.2: Al and Sn-Doped Zinc Indium Oxide Thin Film Transistors for AMOLED Back-Plane," SID Digest 09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates, D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology." IEDM 05. Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Fiim Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using Cg-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007. vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper. 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 As a Charge-Generation Layer," Adv. Mater (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International. Symposium Digest of Technical Papers, 2007, vol. 38, pp. 1737-1740.

Kikuchi, H et al.,"Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the In2O3 and Sc2O3—A2O3—BO Systems [A; Fe, Ga, or Al: B: Mg, Mn, Fe, Ni, Cu,or Zn] at Temperatures over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks;" Liquid Crystals, 1993, vol. 14, No. 3, pp. 911-916.

Kurokawa.Y et al., "UHF RFCPUS on Flexible and Glass Substrates for Secure RFID Systems." Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee. M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995. vol. 150, pp. 1-4 with English translation.

Nakamura, M et al., "The phase relations in the In2O3—Ga2ZnO4—ZnO system of 1350° C.," Journal of Solid State Chemistry, Aug. 1, 1991, vol. 93, No. 2, pp. 298-315.

Nomura, K et ai., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors." Jpn. J. Appl. Phys. (Japanese Journal of Applied Physics) , 2006, vol. 45, No. 5B, pp. 4303-4308.

(56) References Cited

OTHER PUBLICATIONS

Nomura. K et al., "Room-Temperature Fabrication of Transparent Flexible Thin-Film Transistors Using Amorphous Oxide Semiconductors," Nature, Nov. 25, 2004, vol. 432 pp. 486-492.

Nomura. K et al., "Cartier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTS With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Venation for 4.0 inch OVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Galuum Zinc Oxide Thin-Film Transistors by Ar Plasma Treatment," Appl, Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TTFS and Their Application for Large Size AMOLED," AM-FPD '08 Digest of Technical Papers, Juiy 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor" IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No, 5, pp. 1012-1015.

* cited by examiner

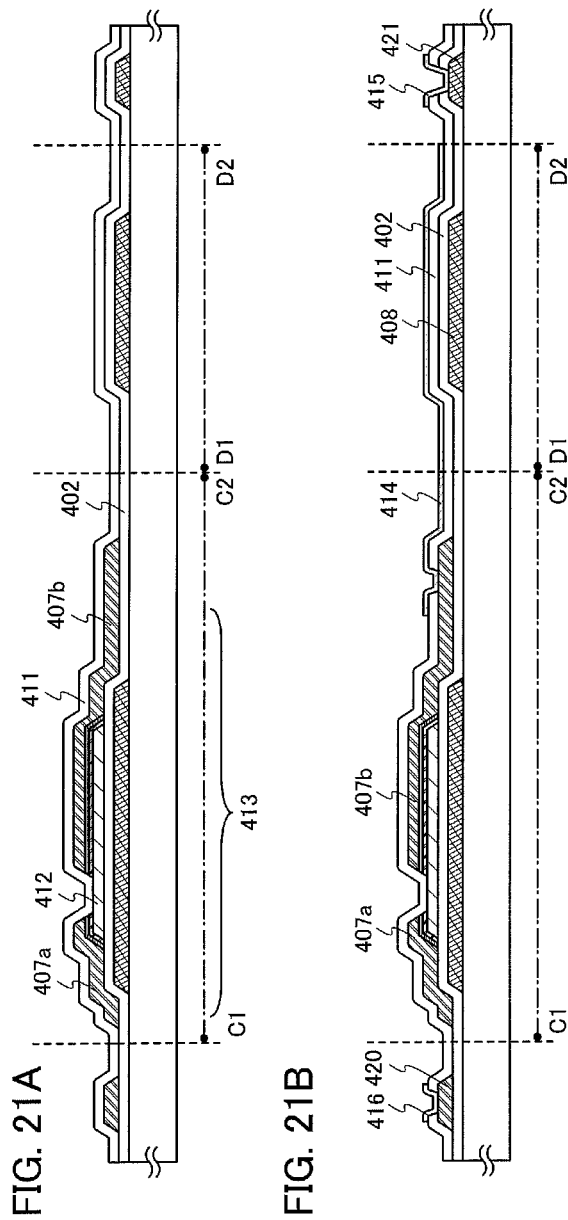

FIG. 22
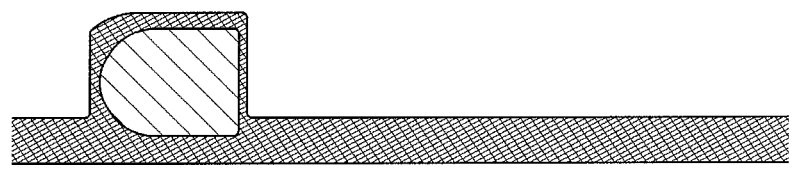
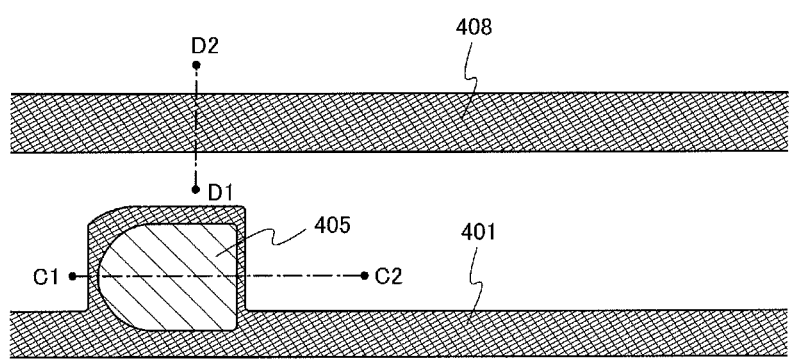
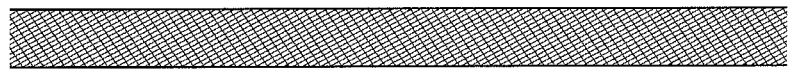

SEMICONDUCTOR DEVICE AND METHOD FOR MANUFACTURING THE SAME

TECHNICAL FIELD

The present invention relates to a thin film transistor including an oxide semiconductor, a semiconductor device including the thin film transistor, and a method for manufacturing the semiconductor device.

BACKGROUND ART

A thin film transistor including a semiconductor film formed over an insulating surface is an essential semiconductor element for a semiconductor device. Since there is limitation on manufacture of thin film transistors in terms of allowable temperature limit of a substrate, a transistor mainly used for a semiconductor display device is a thin film transistor including amorphous silicon that can be deposited at relatively low temperature, polysilicon that can be obtained by crystallization with use of laser light or a catalytic element, or the like in an active layer.

In recent years, a metal oxide having semiconductor characteristics which is referred to as an oxide semiconductor has attracted attention as a novel semiconductor material which has both high mobility, which is a characteristic of polysilicon, and uniform element characteristics, which is a characteristic of amorphous silicon. The metal oxide is used for various applications; for example, indium oxide is a well-known metal oxide and used as a material of a transparent electrode included in a liquid crystal display device or the like. Examples of such metal oxides having semiconductor characteristics include tungsten oxide, tin oxide, indium oxide, zinc oxide, and the like. A thin film transistor including such a metal oxide having semiconductor characteristics in a channel formation region has been known (Patent Documents 1 and 2).

[Reference]
[Patent Document]
[Patent Document 1] Japanese Published Patent Application No. 2007-123861
[Patent Document 2] Japanese Published Patent Application No. 2007-096055

DISCLOSURE OF INVENTION

An object of one embodiment of the present invention disclosed is to provide a thin film transistor having favorable electric characteristics and a semiconductor device including the thin film transistor as a switching element.

The inventors found that a region which is the closest to a source electrode and a drain electrode in an In—Ga—Zn—O-based oxide semiconductor film includes composite layers where the concentration of a metal is higher than that in other regions (metal-rich layers) in a thin film transistor including the In—Ga—Zn—O-based oxide semiconductor film as an active layer of the thin film transistor. The inventors also found that metal oxide films are formed between the source electrode and the composite layer, and between the drain electrode and the composite layer.

FIG. 2 shows a photograph of a cross section of a thin film transistor with a channel-etched structure in which the In—Ga—Zn—O-based oxide semiconductor film is used as an active layer of the thin film transistor. The photograph is taken with a high resolution transmission electron microscope (TEM: "H9000-NAR" manufactured by Hitachi, Ltd.). Both FIGS. 3A and 3B show a high-magnification photograph (four-million-fold magnification) of the interface between an oxide semiconductor film and a titanium film which is in contact with the top of the oxide semiconductor film, by using the same sample as that for the photograph in FIG. 2. Both of the photographs are taken with a scanning transmission electron microscope (STEM: "HD-2700" manufactured by Hitachi, Ltd.) at an accelerating voltage of 200 kV.

A photograph at Point A in FIG. 2 corresponds to FIG. 3A, and a photograph at Point B in FIG. 2 corresponds to FIG. 3B. Specifically, FIG. 3A is a photograph of the interface between the oxide semiconductor film and the titanium film, which is in contact with the top of the oxide semiconductor film, at a position where the oxide semiconductor film overlaps with a gate electrode. As can be seen from FIG. 3A, there is an interface layer containing titanium oxide (TiOx) between the titanium (Ti) film and the In—Ga—Zn—O-based oxide semiconductor film (IGZO). In addition, in the In—Ga—Zn—O-based oxide semiconductor film (IGZO), a region which is the closest to the interface layer containing titanium oxide (TiOx) includes an indium crystal, which can be seen as a grid shape. The layer containing indium that can be seen as a grid shape corresponds to a composite layer where the concentration of indium is higher than that in other regions (an In-rich layer).

In a similar manner, FIG. 3B is a photograph of the interface between the oxide semiconductor film and the titanium film, which is in contact with the top of the oxide semiconductor film, at a position where the oxide semiconductor film does not overlap with the gate electrode. In a manner similar to FIG. 3A, as can be seen from FIG. 3B, there is an interface layer containing titanium oxide (TiOx) between the titanium (Ti) film and the In—Ga—Zn—O-based oxide semiconductor film (IGZO). In addition, in the In—Ga—Zn—O-based oxide semiconductor film (IGZO), a region which is the closest to the interface layer containing titanium oxide (TiOx) includes an In-rich layer.

The inventors thought that the titanium oxide is formed in the following manner: oxygen in the oxide semiconductor film is taken out by titanium in the vicinity of the interface between the oxide semiconductor film and the titanium film; the concentration of In is increased in a region of the oxide semiconductor film which is close to the titanium film; and the oxygen which is taken out is reacted with titanium.

Because a region which is the closest to a source electrode and a drain electrode in an In—Ga—Zn—O-based oxide semiconductor film includes layers where the concentration of one or a plurality of indium, gallium, and zinc is higher than that in other regions (metal-rich layers), the metal-rich layers in the oxide semiconductor film have low resistance. In addition, the titanium oxide films (TiOx) formed between the source electrode and the oxide semiconductor film and between the drain electrode and the oxide semiconductor film have n-type conductivity. Therefore, with the above structure, contact resistance between the source electrode and the oxide semiconductor film and between the drain electrode and the oxide semiconductor film is reduced, and the amount of on-current and field effect mobility of the TFT can be increased.

It is possible to use as the oxide semiconductor, a four-component metal oxide such as an In—Sn—Ga—Zn—O-based oxide semiconductor, a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, and a Sn—Al—Zn—O-based oxide semiconductor, or a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, an In—Ga—O-based oxide semiconductor, an In—O-based oxide semiconductor, a Sn—O-based oxide semiconductor, and a Zn—O-based oxide semiconductor. Note that in this specification, for example, an In—Sn—Ga—Zn—O-based oxide semiconductor means a metal oxide including indium (In), tin (Sn), gallium (Ga), and zinc (Zn), and there is no particular limitation on the stoichiometric proportion. The above oxide semiconductor may contain silicon.

Moreover, oxide semiconductors can be represented by the chemical formula, $InMO_3(ZnO)_m$ (m>0). Here, M represents one or more metal elements selected from Ga, Al, Mn, and Co.

A driver circuit and a pixel portion can be formed over one substrate by using a thin film transistor which is one embodiment of the present invention, and a semiconductor display device can be manufactured by using a display element such as an EL element, a liquid crystal element, or an electrophoretic element.

Since a thin film transistor is easily broken due to static electricity or the like, a protective circuit for protecting the thin film transistor for the pixel portion is preferably provided over the same substrate for a gate line or a source line. The protective circuit is preferably formed using a nonlinear element in which an oxide semiconductor film is used.

The thin film transistor which is one embodiment of the present invention may be a bottom-gate thin film transistor with a channel-etched structure, or may be a bottom-gate thin film transistor with a channel-protective structure. Alternatively, the thin film transistor may be a bottom-contact thin film transistor.

The bottom-gate transistor includes a gate electrode formed over an insulating surface, a gate insulating film over the gate electrode, an oxide semiconductor film which overlaps with the gate electrode over the gate insulating film and which includes composite layers where the concentration of one or a plurality of metals contained in the oxide semiconductor is higher than that in other regions, a pair of metal oxide films formed over the oxide semiconductor film and in contact with the composite layers, and a source electrode and a drain electrode which are in contact with the metal oxide films. The metal oxide films are formed by oxidation of a metal contained in the source electrode and the drain electrode.

The bottom-contact transistor includes a gate electrode formed over an insulating surface, a gate insulating film over the gate electrode, a source electrode and a drain electrode over the gate insulating film, metal oxide films in contact with the source electrode and the drain electrode, and an oxide semiconductor film which overlaps with the gate electrode and which includes composite layers where the concentration of one or a plurality of metals contained in the oxide semiconductor is higher than that in other regions. The composite layers are in contact with the metal oxide films. The metal oxide films are formed by oxidation of a metal contained in the source electrode and the drain electrode.

Because a region which is the closest to a source electrode and the drain electrode in an oxide semiconductor film includes composite layers where the concentration of a metal is higher than that in other regions, and metal oxide films having n-type conductivity are formed between the source electrode and the oxide semiconductor film and between the drain electrode and the oxide semiconductor film, contact resistance between the source electrode and the oxide semiconductor film and between the drain electrode and the oxide semiconductor film is reduced, and the amount of on-current and field effect mobility of a TFT can be increased.

BRIEF DESCRIPTION OF DRAWINGS

FIGS. 21A and 21B show the method for manufacturing a semiconductor device.

FIG. 22 shows the method for manufacturing a semiconductor device.

BEST MODE FOR CARRYING OUT THE INVENTION

Figure 1A:
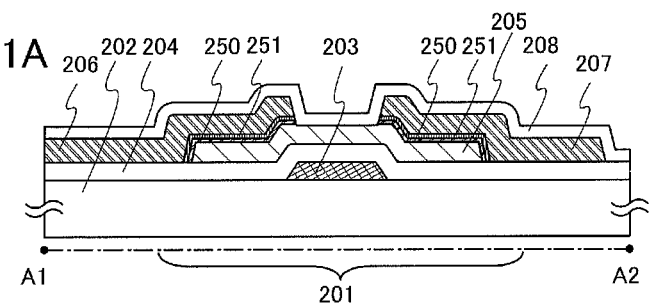
FIGS. 1A and 1C illustrate cross-sectional views of a transistor.

Hereinafter, embodiments of the present invention will be described in detail with reference to the accompanying drawings. However, the present invention is not limited to the following description and it is easily understood by those skilled in the art that modes and details can be variously changed without departing from the scope and spirit of the present invention. Therefore, the invention should not be construed as being limited to the description of the embodiments below.

The present invention can be applied to manufacture of any kind of semiconductor devices including microprocessors, integrated circuits such as image processing circuits, RF tags, and semiconductor display devices. The semiconductor display devices include the following in its category: liquid crystal display devices, light-emitting devices in which a light-emitting element typified by an organic light-emitting element (OLED) is provided for each pixel, electronic papers, digital micromirror devices (DMDs), plasma display panels (PDPs), field emission displays (FEDs), and other semiconductor display devices in which a circuit element using a semiconductor film is included in a driver circuit.

Note that the semiconductor display devices include a panel in which a display element is sealed, and a module in which an IC and the like including a controller are mounted on the panel. The present invention further relates to one mode of an element substrate before the display element is completed in the manufacturing process of the semiconductor display device, and the element substrate is provided with a means for applying a current or a voltage to the display element in each of a plurality of pixels. Specifically, the element substrate may be in a state in which only a pixel electrode of the display element is provided, a state after formation of a conductive film to be a pixel electrode and before etching of the conductive film to form the pixel electrode, or any other states.

(Embodiment 1)

In this embodiment, described are results of computational science investigation on the phenomenon that a layer where the concentration of indium is higher than that in the other regions (an In-rich layer) and a titanium oxide film (TiOx) are formed in the vicinity of the interface between a metal film used as a source electrode or a drain electrode and an In—Ga—Zn—O-based oxide semiconductor film of a thin film transistor with a channel-etched structure using the In—Ga—Zn—O-based oxide semiconductor film as an active layer of the thin film transistor.

First, energy that is needed for formation of an oxygen-deficiency state (deficiency formation energy $E_{def}$) in respective case of indium oxide, gallium oxide, and zinc oxide, which are contained in an In—Ga—Zn—O-based oxide semiconductor, was calculated to investigate which metal oxide is likely to form the oxygen-deficiency state.

Note that the deficiency formation energy $E_{def}$ is defined as Formula 1 below. A represents one of the following: indium; gallium; zinc; and indium, gallium, and zinc. Note that E(O) represents half energy of an oxygen molecule, and $E(A_mO_{n-1})$ represents energy of an oxide $A_mO_{n-1}$ including oxygen deficiency.

$$E_{def}=E(A_mO_{n-1})+E(O)-E(A_mO_n) \quad \text{(Formula 1)}$$

Relation between the concentration of deficiency n and the deficiency formation energy $E_{def}$ is approximately shown as Formula 2 below. Note that N represents the number of oxygen positions in the state where deficiency is not formed, $k_B$ represents Boltzman constant, and T represents temperature.

$$n=N\times\exp(-E_{def}/k_BT) \quad \text{(Formula 2)}$$

For calculation, CASTEP, which is a program for a density functional theory, was used. A plan wave basis pseudopotential method was used as a method for the density functional theory. GGAPBE was used for a functional. The cut-off energy was 500 eV. The k-point sets for IGZO, $In_2O_3$, $Ga_2O_3$, and ZnO were grids of 3×3×1, 2×2×2, 2×3×2, and 4×4×1, respectively.

A crystal structure of an IGZO crystal was a structure of 84 atoms which was obtained by doubling a structure having a symmetry of R-3 (international number: 148) in both a-axis and b-axis direction, and by arranging Ga and Zn such that the energy becomes a minimum. Crystal structures of $In_2O_3$, $Ga_2O_3$, and ZnO are a bixbyite structure of 80 atoms, a β-gallia structure of 80 atoms, and an wurtzite structure of 80 atoms, respectively.

From Formula 2, it is found that as the deficiency formation energy $E_{def}$ is increased, the concentration of oxygen deficiency n, i.e., the amount of oxygen deficiency, is decreased. Table 1 below shows values of deficiency formation energy $E_{def}$ in cases where A is indium; gallium; zinc; and indium, gallium, and zinc.

Figure 4A:
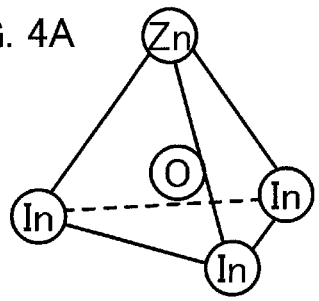
FIGS. 4A to 4C illustrate crystal structures of metals and oxygen in IGZO.

Note that the value of the deficiency formation energy $E_{def}$ of IGZO (Model 1) is a value of the deficiency formation energy $E_{def}$ of an oxygen atom adjacent to three indium atoms and one zinc atom in a crystal in the case where A is indium, gallium, and zinc. FIG. 4A illustrates a structure of a portion which is formed by three indium atoms, one zinc atom, and an oxygen atom that is adjacent to these metal atoms in an IGZO crystal.

Figure 4B:
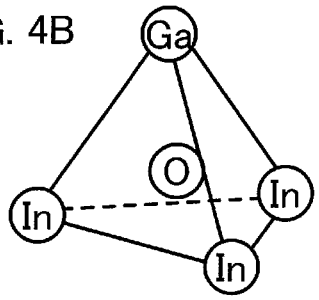

Note also that the value of the deficiency formation energy $E_{def}$ of IGZO (Model 2) is a value of the deficiency formation energy $E_{def}$ of an oxygen atom adjacent to three indium atoms and one gallium atom in a crystal in the case where A is indium, gallium, and zinc. FIG. 4B illustrates a structure of a portion which is formed by three indium atoms, one gallium atom, and an oxygen atom that is adjacent to these metal atoms in an IGZO crystal.

Figure 4C:
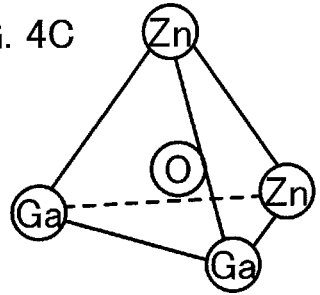

Note also that the value of the deficiency formation energy $E_{def}$ of IGZO (Model 3) is a value of the deficiency formation energy $E_{def}$ of an oxygen atom adjacent to two zinc atoms and two gallium atoms in a crystal in the case where A is indium, gallium, and zinc. FIG. 4C illustrates a structure of a portion which is formed by two zinc atoms, two gallium atoms, and an oxygen atom that is adjacent to these metal atoms in an IGZO crystal.

TABLE 1

| Compound | $E_{def}$(eV) |
|---|---|
| $In_2O_3$ | 3.06 |
| ZnO | 3.75 |
| IGZO (Model 1) | 3.73 |
| IGZO (Model 2) | 3.98 |
| IGZO (Model 3) | 4.08 |
| $Ga_2O_3$ | 4.18 |

As the value of deficiency formation energy $E_{def}$ becomes high, the energy needed for formation of an oxygen-deficiency state is increased, that is, a bond between oxygen and metal tends to be stronger. Therefore, from the values of deficiency formation energy $E_{def}$ shown in Table 1, it is found that indium has the weakest bond with oxygen and that oxygen is likely to be taken out in the vicinity of indium.

The oxygen-deficiency state in an In—Ga—Zn—O-based oxide semiconductor is likely to be formed because oxygen is taken out from the oxide semiconductor by a metal used for a source electrode and a drain electrode. Electrical conductivity of the oxide semiconductor is increased by formation of the oxygen-deficiency state; therefore, when oxygen is taken out in the above-described manner, electrical conductivity of an oxide semiconductor film in the vicinity of the interface between the oxide semiconductor film and a metal film is expected to be increased.

Next, in order to confirm whether or not oxygen is taken out from an oxide semiconductor by a metal, a quantum-mechanically stable structure model in the vicinity of the interface between an In—Ga—Zn—O-based oxide semiconductor film and a metal film was investigated by calculation using a quantum molecular dynamics (QMD) method.

A structure for calculation was manufactured in the following manner. First, a unit cell including 84 atoms of $In_{12}Ga_{12}Zn_{12}O_{48}$ was extracted from an amorphous In—Ga—Zn—O-based oxide semiconductor (a-IGZO) that was formed by a classical molecular dynamics (CMD) method, and the structure was optimized by quantum molecular dynamics (QMD) and a first-principle structure optimization. By cutting the structure-optimized unit cell, a-IGZO layers were obtained. Over the a-IGZO layers, metal layers having crystals of respective metal atoms (W, Mo, and Ti) were stacked. After that, the manufactured structures were optimized. Each of these structures was used as a starting object, and calculation was performed by using the quantum molecular dynamics (QMD) method at 623.0 K. Note that the lower end of each of the a-IGZO layers and the top end of each of the metal layers were fixed so that only interaction at the interface could be estimated.

Calculation conditions for the classical molecular dynamics calculation are shown below. Materials Explorer was used as a calculation program. A-IGZO was formed under the following conditions. In a calculation cell having a length of 1 nm on each side, 84 atoms in total (the ratio was In:Ga:Zn: O=1:1:1:4) were randomly arranged, and the density was set to 5.9 g/cm³. The temperature was gradually lowered from 5500 K to 1 K in the NVT ensemble. The total calculation time was 10 ns with time intervals of 0.1 fs. Potentials between metal and oxygen, and between oxygen and oxygen were of a Born-Mayer-Huggins type, and a potential between metal and metal was of an UFF type. Electrical charges of In, Ga, Zn, and O were +3, +3, +2, and −2, respectively.

Calculation conditions for the QMD calculation are shown below. A first principle calculation software, CASTEP, was used as a calculation program. GGAPBE was used for a functional, and an ultrasoft type was used for pseudopotential. The cut-off energy was 260 eV, and the k-point set was 1×1×1. The MD calculation was performed in the NVT ensemble, and the temperature was 623 K. The total calculation time was 2.0 ps with time intervals of 1.0 fs.

Figure 5A:
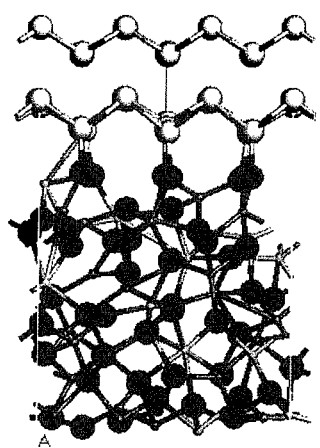
FIGS. 5A and 5B illustrate structural models of metal atoms and oxygen atoms in the vicinity of the interface between a tungsten film and an oxide semiconductor film.
Figure 5B:
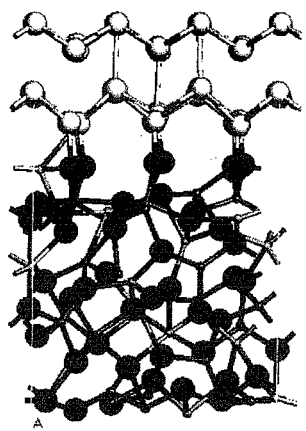
Figure 6A:
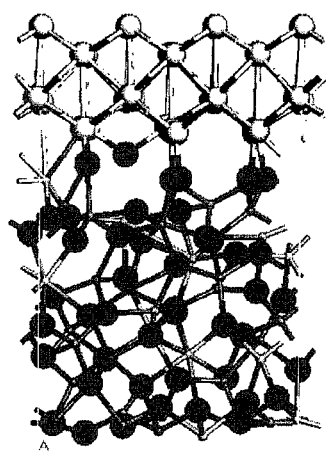
FIGS. 6A and 6B illustrate structural models of metal atoms and oxygen atoms in the vicinity of the interface between a molybdenum film and an oxide semiconductor film.
Figure 6B:
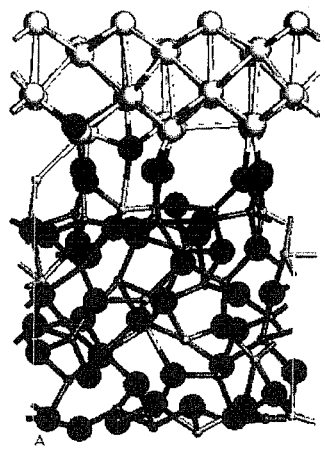
Figure 7A:
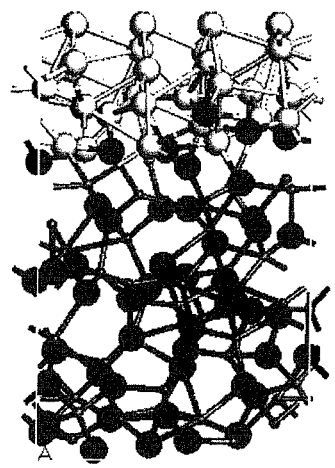
FIGS. 7A and 7B illustrate structural models of metal atoms and oxygen atoms in the vicinity of the interface between a titanium film and an oxide semiconductor film.
Figure 7B:
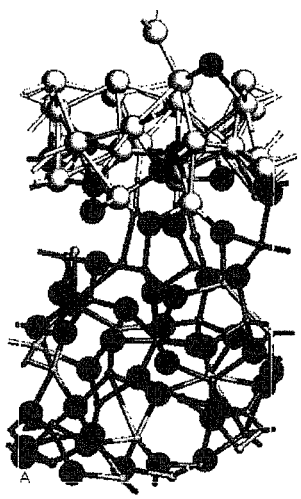

FIGS. 5A and 5B, FIGS. 6A and 6B, and FIGS. 7A and 7B are calculation results. In FIGS. 5A and 5B, FIGS. 6A and 6B, and FIGS. 7A and 7B, white circles represent any of metal atoms of W, Mo, and Ti, and black circles represent oxygen atoms. FIGS. 5A and 5B illustrate structural models in the case of using a metal layer of W. FIG. 5A illustrates the structural model before calculation by the QMD method, and FIG. 5B illustrates the structural model after the calculation by the QMD method. FIGS. 6A and 6B illustrate structural models in the case of using a metal layer of Mo. FIG. 6A illustrates the structural model before calculation by the QMD method, and FIG. 6B illustrates the structural model after the calculation by the QMD method. FIGS. 7A and 7B illustrate structural models in the case of using a metal layer of Ti. FIG. 7A illustrates the structural model before calculation by the QMD method, and FIG. 7B illustrates the structural model after the calculation by the QMD method.

From FIG. 6A and FIG. 7A, it is found that oxygen already transfers to the metal layer at the time of structural optimization in the case of using Mo and the case of using Ti. From comparison among FIG. 5B, FIG. 6B, and FIG. 7B, it is found that the largest amount of oxygen transfers in the case of using Ti. It is considered that the most suitable material for an electrode which causes oxygen-deficiency in a-IGZO is Ti.

Oxygen that is taken out by titanium reacts with titanium, resulting in titanium oxide. Then, investigation was conducted to see whether or not the titanium oxide film formed between the oxide semiconductor film and the titanium film has conductivity.

Figure 8:
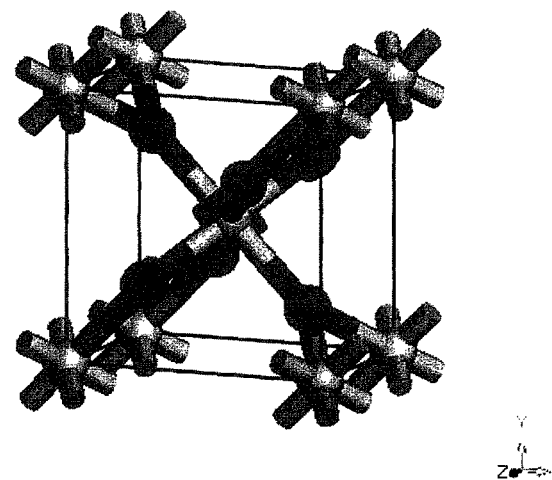
FIG. 8 illustrates a crystal structure of titanium dioxide having a rutile structure.

Titanium dioxide can have some types of crystal structures such as a rutile structure (a tetragonal system obtained at high temperature), an anatase structure (a tetragonal system obtained at low temperature), and a brookite structure (an orthorhombic system). Since the anatase structure and the brookite structure turn into the rutile structure, which is the most stable structure, by being heated, the titanium oxide was assumed to have the rutile structure. A crystal structure of titanium oxide having the rutile structure is shown in FIG. 8. The rutile structure is a tetragonal system, and the space group of crystal symmetry is $P4_2/mnm$.

Calculation for obtaining state density of the titanium dioxide structure was performed by using a density functional theory using a GGAPBE functional. While symmetry was maintained, the structure including the cell structure was optimized and the state density was calculated. For calculation of a density functional, a plane wave pseudopotential method in a CASTEP code was used. The cut-off energy was 380 eV.

Figure 9:
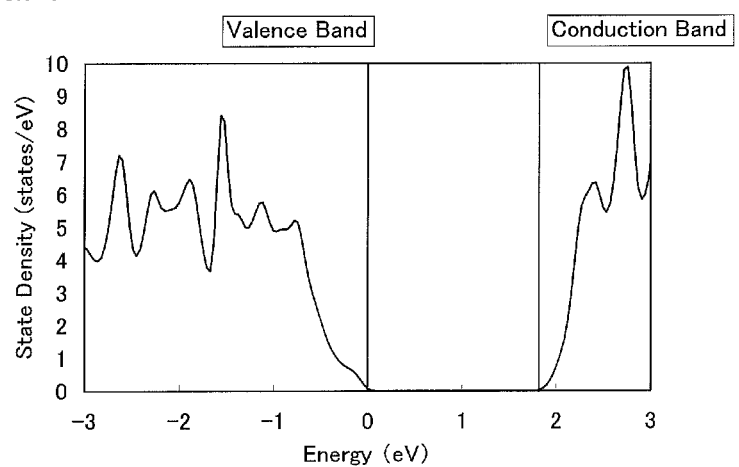
FIG. 9 shows a state density of titanium dioxide having a rutile structure.

FIG. 9 shows the state density of titanium dioxide having the rutile structure. From FIG. 9, it is found that titanium dioxide having the rutile structure has a band gap, and that it has state density similar to that of an insulator or a semiconductor. Note that in the density functional theory, the band gap tends to be estimated small; therefore, the actual band gap of titanium dioxide is approximately 3.0 eV, which is larger than the band gap shown in the state density of FIG. 9.

Figure 10:
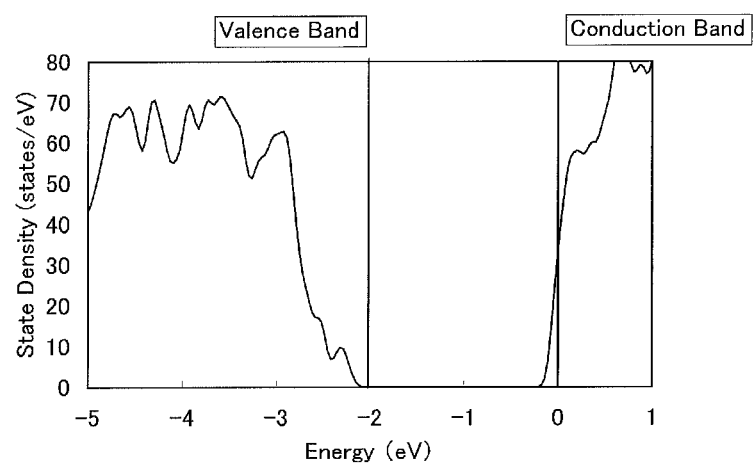
FIG. 10 shows a state density of titanium dioxide in an oxygen-deficiency state.

Next, FIG. 10 shows the state density of titanium dioxide having the rutile structure including oxygen deficiency. Specifically, titanium oxide having 24 Ti atoms and 47 O atoms, which was obtained by removing one O atom from titanium oxide having 24 Ti atoms and 48 O atoms, was used as a model for calculation. From the state density of FIG. 10, it is found that the Fermi level moves above the band gap; therefore, in the case where oxygen deficiency is formed, titanium dioxide has n-type conductivity.

Figure 11:
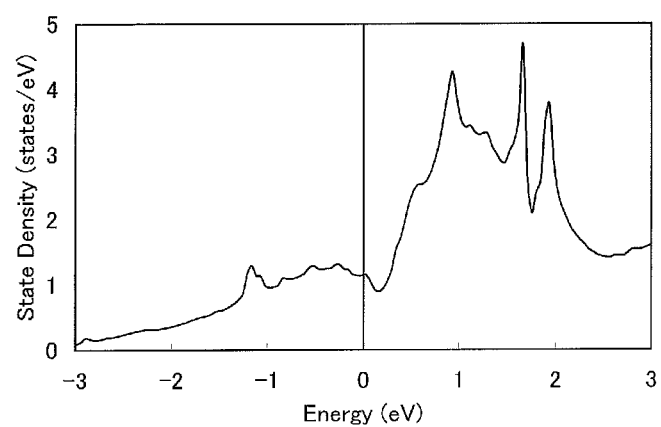
FIG. 11 shows a state density of a titanium monoxide.

Next, FIG. 11 shows the state density of titanium monoxide (TiO). From FIG. 11, it is found that titanium monoxide has a state density that is similar to that of a metal.

Therefore, from the state density of titanium dioxide in FIG. 9, the state density of titanium dioxide including oxygen deficiency in FIG. 10, and the state density of titanium monoxide in FIG. 11, it is expected that titanium dioxide including oxygen deficiency ($TiO_{2-\delta}$) has n-type conductivity when $0<\delta<1$. Therefore, even in the case where a titanium oxide film contains any of titanium dioxide, titanium monoxide, and titanium dioxide including oxygen deficiency as a component, the titanium oxide film is considered to be unlikely to inhibit current flow between an In—Ga—Zn—O-based oxide semiconductor film and a titanium film.

Figure 29:
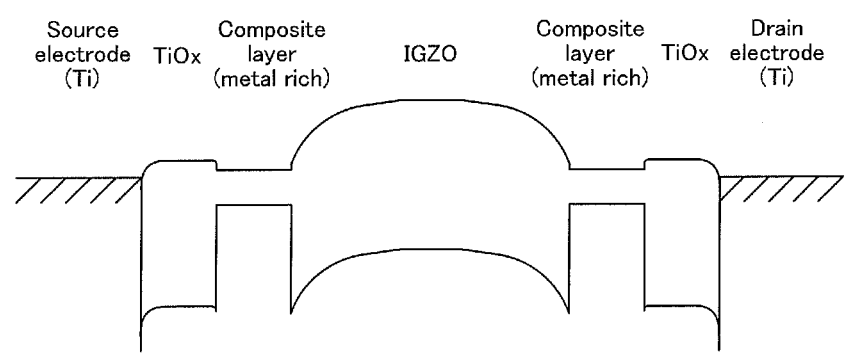
FIG. 29 illustrates a band diagram of an embodiment of the present invention.

FIG. 29 shows an energy band diagram between a source electrode and a drain electrode in a thin film transistor. Note that in FIG. 29, an In—Ga—Zn—O-based non-single-crystal film (IGZO) is used as an oxide semiconductor film, and TiOx films are included between the oxide semiconductor film and the source electrode, and between the oxide semiconductor film and the drain electrode of the thin film transistor. Note that the thickness of the TiOx films is more than or equal to 0.1 nm and less than or equal to 10 nm. The above oxide semiconductor film contains a large number of metal atoms (e.g., In, Ga, and Zn) and a pair of composite layers that are in contact with the above pair of TiOx films. Electron affinity of the In—Ga—Zn—O-based non-single-crystal film (IGZO) in a region other than the composite layers, electron affinity of the TiOx films, electron affinity of Ti for the source electrode and the drain electrode, and electron affinity of the composite layers are 4.3 eV, 4.3 eV, 4.1 eV, and 4.5 eV, respectively. Note that in FIG. 29, the positions of the bands change so that Fermi levels of the substances are equal. When a gate voltage is not applied, since the number of carriers in IGZO is small, the Fermi level is near the center of the band gap. Since the number of carriers in the TiOx films and the composite layers are large, the position of the Fermi level is close to the conduction band. Therefore, in FIG. 29, the position of a conduction band of each substance differs from the above-described relative value of electron affinity. Since there is almost no difference between the electron affinities of the composite layers as shown in FIG. 29, it is possible to realize a favorable connection structure between the oxide semiconductor film and the source electrode, and between the oxide semiconductor film and the drain electrode.

(Embodiment 2)

In this embodiment, a structure of a thin film transistor which includes an oxide semiconductor film in a channel formation region is described by taking an example of a bottom-gate transistor with a channel-etched structure.

Figure 1B:
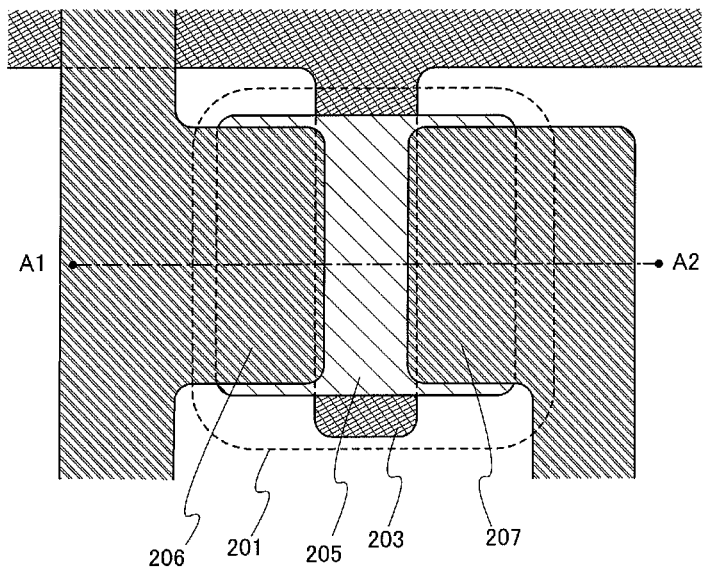
FIG. 1B illustrates a top view thereof.

FIG. 1A illustrates a cross-sectional view of a thin film transistor 201 and FIG. 1B illustrates a top view of the thin film transistor 201 illustrated in FIG. 1A. Note that a cross-sectional view taken along dashed line A1-A2 in FIG. 1B corresponds to FIG. 1A.

The thin film transistor 201 includes a gate electrode 203 formed over a substrate 202 having an insulating surface, a gate insulating film 204 over the gate electrode 203, an oxide semiconductor film 205 which overlaps with the gate electrode 203 over the gate insulating film 204 and which includes composite layers 250 where the concentration of one or a plurality of metals contained in the oxide semiconductor is higher than that in other regions, a pair of metal oxide films 251 formed over the oxide semiconductor film 205 and in contact with the composite layers 250, and a source electrode 206 and a drain electrode 207 which are in contact with the metal oxide films 251. Further, the thin film transistor 201 may include as its component an oxide insulating film 208 formed over the oxide semiconductor film 205. The metal oxide films 251 are formed by oxidation of a metal contained in the source electrode 206 and the drain electrode 207.

Figure 1C:
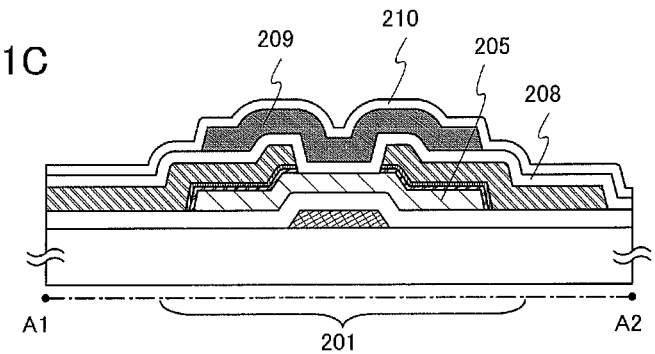
Figure 2:
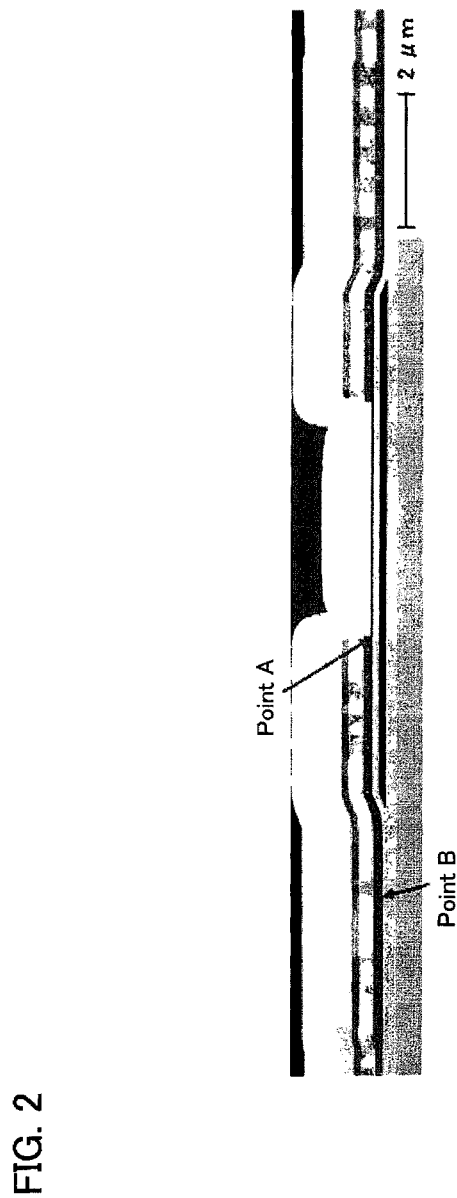
FIG. 2 shows a cross-sectional TEM photograph of a thin film transistor.
Figure 3A:
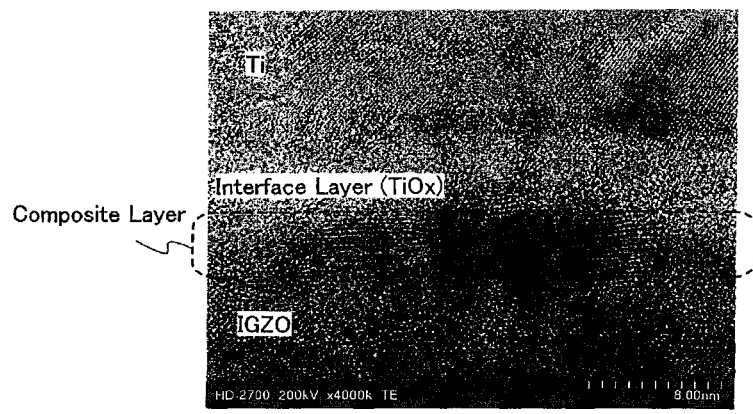
FIGS. 3A and 3B show cross-sectional TEM photographs in the vicinity of the interface between an oxide semiconductor film and a source electrode or between the oxide semiconductor film and a drain electrode in a thin film transistor.
Figure 3B:
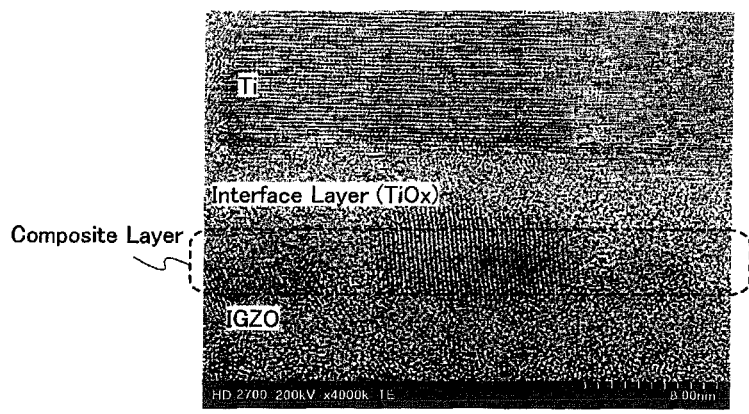

Note that the thin film transistor 201 illustrated in FIGS. 1A to 1C has a channel-etched structure in which part of the oxide semiconductor film 205 is etched between the source electrode 206 and the drain electrode 207.

An insulating film as a base film may be formed between the gate electrode 203 and the substrate 202. The base film can be formed with a single layer or a stacked layer using one or more of insulating films which prevent diffusion of impurity elements from the substrate 202, specifically, a silicon nitride film, a silicon oxide film, a silicon nitride oxide film, and a silicon oxynitride film.

A material for the gate electrode 203 can be a single layer or a stacked layer using one or more of a metal material such as molybdenum, titanium, chromium, tantalum, tungsten, neodymium, or scandium, or an alloy material which contains any of these metal materials as a main component, or a nitride of these metals. Note that aluminum or copper can also be used as the above metal material as long as it can withstand a temperature of heat treatment performed in a later step. Aluminum or copper is preferably used in combination with a refractory metal material in order to avoid problems with heat resistance and corrosion. As the refractory metal material, molybdenum, titanium, chromium, tantalum, tungsten, neodymium, scandium, or the like can be used.

For example, as a two-layer structure of the gate electrode 203, it is preferable to stack a titanium nitride film and a molybdenum film. As a three-layer structure, it is preferable to stack a tungsten film or a tungsten nitride film, an alloy film of aluminum and silicon or an alloy film of aluminum and titanium, and a titanium nitride film or a titanium film.

Further, by using a light-transmitting oxide conductive film of indium oxide, an indium oxide-tin oxide alloy, an indium oxide-zinc oxide alloy, zinc oxide, zinc aluminum oxide, zinc aluminum oxynitride, zinc gallium oxide, or the like, the aperture ratio of a pixel portion can be increased.

In this specification, oxynitride refers to a substance which contains more oxygen than nitrogen, and nitride oxide refers to a substance which contains more nitrogen than oxygen.

The thickness of the gate electrode 203 is 10 nm to 400 nm, preferably 100 nm to 200 nm. In this embodiment, after a conductive film with a thickness of 100 nm for the gate electrode is formed by a sputtering method using a tungsten target, the conductive film is processed (patterned) by etching to have a desired shape, so that the gate electrode 203 is formed.

The gate insulating film 204 can be formed with a single layer of a silicon oxide film, a silicon nitride film, a silicon oxynitride film, a silicon nitride oxide film, an aluminum oxide film, or a tantalum oxide film or a stacked layer thereof by a plasma CVD method, a sputtering method, or the like. In this embodiment, a silicon oxynitride film with a thickness of 100 nm is used as the gate insulating film 204.

After the oxide semiconductor film is formed by a sputtering method using an oxide semiconductor as a target, the oxide semiconductor film is processed into a desired shape by etching or the like, so that the island-shaped oxide semiconductor film 205 is formed. The oxide semiconductor film can be formed by a sputtering method under a rare gas (for example, argon) atmosphere, an oxygen atmosphere, or a mixed atmosphere including a rare gas and oxygen. The thickness of the island-shaped oxide semiconductor film 205 is more than or equal to 10 nm and less than or equal to 300 nm, preferably, more than or equal to 20 nm and less than or equal to 100 nm.

As the oxide semiconductor film 205, the oxide semiconductor described above can be used.

In this embodiment, as the oxide semiconductor film 205, an In—Ga—Zn—O-based non-single-crystal film with a thickness of 50 nm, which is obtained by a sputtering method using an oxide semiconductor target including indium (In), gallium (Ga), and zinc (Zn) ($In_2O_3:Ga_2O_3:ZnO=1:1:1$), is used.

After a conductive film for a source electrode and a drain electrode is formed over the island-shaped oxide semiconductor film 205, the conductive film is patterned by etching or the like, so that the source electrode 206 and the drain electrode 207 are formed. When the source electrode 206 and the drain electrode 207 are formed by the patterning, an exposed portion of the island-shaped oxide semiconductor film 205 is partly etched in some cases. In this case, in the oxide semiconductor film 205, the thickness of a region between the source electrode 206 and the drain electrode 207 becomes smaller than the thickness of regions which overlap with the source electrode 206 or the drain electrode 207, as illustrated in FIG. 1A.

As a material of a conductive film for the source electrode and the drain electrode, for example, an element selected from titanium, tungsten, and molybdenum, an alloy containing one or more of the above elements, or the like can be used. In a semiconductor device of one embodiment of the present invention, in the source electrode 206 and the drain electrode 207, at least a portion which is the closest to the island-shaped oxide semiconductor film 205 may be formed using an element selected from titanium, tungsten, and molybdenum, an alloy containing one or more of the above elements, or the like. Therefore, in the case where the source electrode 206 and the drain electrode 207 each having a structure in which a plurality of metal films are stacked, a metal film that is in contact with the oxide semiconductor film 205 may be formed using titanium, tungsten, or molybdenum, and the other metal films can be formed using any of the following examples: an element selected from aluminum, chromium, tantalum, titanium, manganese, magnesium, molybdenum, tungsten, zirconium, beryllium, and yttrium; an alloy containing one or more of the above elements as a component; a nitride containing the above element as a component; or the like. For example, by using a conductive film having a stacked structure of a titanium film, an aluminum alloy film containing neodymium, and a titanium film, and by using the titanium film in the portion which is the closest to the island-shaped oxide semiconductor film 205, the source electrode 206 and the drain electrode 207 can have a low resistance and high heat resistance in the aluminum alloy film containing neodymium.

Note that in the case where heat treatment is performed after the formation of the conductive film for the source electrode and the drain electrode, the conductive film preferably has heat resistance enough to withstand the heat treatment. In the case of performing heat treatment after the formation of the conductive film, the conductive film is formed in combination with the heat-resistant conductive material because aluminum alone has problems of low heat resistance, being easily corroded, and the like. As the heat-resistant conductive material which is combined with aluminum, the following material is preferably used: an element selected from titanium, tantalum, tungsten, molybdenum, chromium, neodymium, and scandium; an alloy containing one or more of these elements as a component; a nitride containing any of these elements as a component; or the like.

The thickness of the conductive film for the source electrode and the drain electrode is 10 nm to 400 nm, preferably 100 nm to 200 nm. In this embodiment, after a conductive film for a source electrode and a drain electrode is formed by a sputtering method using a titanium target, the conductive film is processed (patterned) by etching to have a desired shape, so that the source electrode 206 and the drain electrode 207 are formed.

By forming the source electrode 206 and the drain electrode 207 having the above structure, oxygen in the region of the oxide semiconductor film 205 which is the closest to the source electrode 206 and the drain electrode 207 is taken out, so that the composite layers 250 where the concentration of a metal contained in the oxide semiconductor film 205 is higher than that in other regions (metal-rich layers) are formed in the oxide semiconductor film 205. The oxygen that is taken out reacts with the metal in the source electrode 206 and the drain electrode 207, so that the metal oxide films 251 are formed between the metal-rich composite layer 250 and the source electrode 206, and between the metal-rich composite layer 250 and the drain electrode 207. The thickness of the metal-rich composite layers 250 is more than or equal to 2 nm and less than or equal to 10 nm, and the thickness of the metal oxide films 251 is more than or equal to 2 nm and less than or equal to 10 nm.

For example, in the case where an In—Ga—Zn—O-based oxide semiconductor is used for the oxide semiconductor film 205, the composite layers 250 where the concentration of indium is higher than that in other regions (In-rich layers) exist in regions of the oxide semiconductor film 205 which are the closest to the source electrode 206 and the drain electrode 207, so that resistance of the In-rich composite layers 250 in the oxide semiconductor film 205 becomes lower. In the case where titanium is used for the source electrode 206 and the drain electrode 207, the metal oxide films 251 formed between the source electrode 206 and the oxide semiconductor film 205 and between the drain electrode 207 and the oxide semiconductor film 205 contain titanium oxide (TiOx) and have n-type conductivity. Therefore, with the above structure, contact resistance between the source electrode 206 and the oxide semiconductor film 205 and between the drain electrode 207 and the oxide semiconductor film 205 is reduced, and the amount of on-current and field effect mobility of a TFT can be increased.

The oxide insulating film 208 is formed to be in contact with the island-shaped oxide semiconductor film 205, the source electrode 206, and the drain electrode 207 by a sputtering method. The oxide insulating film 208 in contact with the island-shaped oxide semiconductor film 205 is preferably formed using an inorganic insulating film which contains as few impurities, e.g., moisture, hydrogen, and a hydroxy group, as possible and blocks entry of these impurities from the outside, such as a silicon oxide film, a silicon nitride oxide film, an aluminum oxide film, or an aluminum oxynitride film. In this embodiment, a silicon oxide film with a thickness of 300 nm is preferably formed as the oxide insulating film 208.

When the oxide insulating film 208 is formed in contact with the oxide semiconductor film 205 by a sputtering method, a PCVD method, or the like, oxygen is supplied to at least a region of the oxide semiconductor film 205 which is in contact with the oxide insulating film 208, and resistance becomes higher because the carrier concentration becomes low, preferably to a value of less than $1\times10^{18}/cm^3$; as a result, a high-resistance oxide semiconductor region is formed. By forming the oxide insulating film 208, the oxide semiconductor film 205 has a high-resistance oxide semiconductor region in vicinity of an interface between the oxide semiconductor film 205 and the oxide insulating film 208.

Note that as illustrated in FIG. 1C, the thin film transistor 201 may further include a conductive film 209 over the oxide insulating film 208. A material or stacked layer structure similar to that for the gate electrode 203 can be used for the conductive film 209. The thickness of the conductive film 209 is 10 nm to 400 nm, preferably 100 nm to 200 nm. A resist mask is formed by a photolithography method and a conductive film is processed (patterned) to have a desired shape. The conductive film 209 is formed so as to overlap with a channel formation region in the oxide semiconductor film 205. The conductive film 209 may be in a floating state, that is, electrically insulated, or may be in a state in which a potential is given. In the latter case, a potential having the same level as the gate electrode 203 or a fixed potential such as a ground potential may be given to the conductive film 209. By controlling the level of a potential given to the conductive film 209, the threshold voltage of the thin film transistor 201 can be controlled.

Further, in the case of forming the conductive film 209, an insulating film 210 is formed so as to cover the conductive film 209. The insulating film 210 is formed using an inorganic insulating film which contains as few impurities, e.g., moisture, hydrogen, and a hydroxy group, as possible and blocks entry of these impurities from the outside, such as a silicon oxide film, a silicon nitride oxide film, an aluminum oxide film, or an aluminum oxynitride film.

A thin film transistor using an oxide semiconductor has high mobility compared to a thin film transistor using amorphous silicon, and uniform element characteristics similar to those of a thin film transistor using amorphous silicon. Accordingly, an oxide semiconductor can be used for not only a pixel portion but also a semiconductor element which forms a driver circuit with higher driving frequency than the pixel portion. A system-on-panel can be realized without a process of crystallization or the like.

This embodiment can be implemented in combination with the above embodiment.

(Embodiment 3)

In this embodiment, a structure of a bottom-contact thin film transistor which is different from that of the thin film transistor 201 illustrated in Embodiment 2 is described. For the same portions as those in Embodiment 2 or portions having functions similar to those in Embodiment 2, Embodiment 2 can be referred to, and repetitive description thereof is omitted.

Figure 12A:
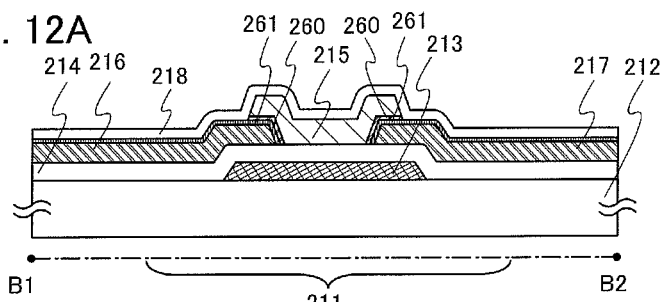
FIGS. 12A and 12C illustrate cross-sectional views of a transistor.
Figure 12B:
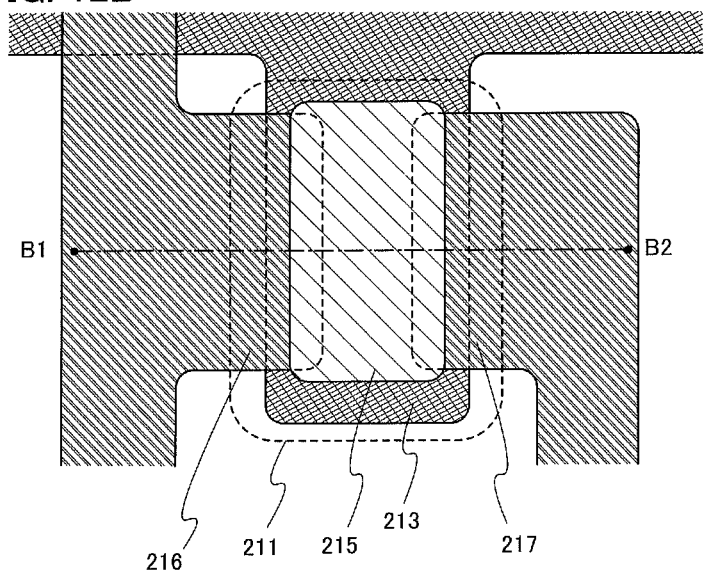
FIG. 12B illustrates a top view thereof.

FIG. 12A illustrates a cross-sectional view of a thin film transistor 211, and FIG. 12B illustrates a top view of the thin film transistor 211 illustrated in FIG. 12A. Note that a cross-sectional view taken along dashed line B1-B2 in FIG. 12B corresponds to FIG. 12A.

The thin film transistor 211 includes a gate electrode 213 formed over a substrate 212 having an insulating surface, a gate insulating film 214 over the gate electrode 213, a source electrode 216 or a drain electrode 217 over the gate insulating film 214, metal oxide films 261 in contact with the source electrode 216 or the drain electrode 217, and an oxide semiconductor film 215 which overlaps with the gate electrode 213 and which includes composite layers 260 where the concentration of one or a plurality of metals contained in the oxide semiconductor is higher than that in other regions. The composite layers 260 are in contact with the metal oxide films 261. Further, the thin film transistor 211 may include as its component an oxide insulating film 218 formed over the oxide semiconductor film 215. The metal oxide films 261 are formed by oxidation of a metal contained in the source electrode 216 and the drain electrode 217.

An insulating film as a base film may be provided between the gate electrode 213 and the substrate 212. The base film can be formed using a material and a stacked layer structure similar to those in Embodiment 2. In addition, the gate electrode 213 can be formed using the material and stacked layer structure similar to those in Embodiment 2.

The thickness of the gate electrode 213 is 10 nm to 400 nm, preferably 100 nm to 200 nm. In this embodiment, after a conductive film with a thickness of 100 nm for the gate electrode is formed by a sputtering method using a tungsten target, the conductive film is processed (patterned) by etching to have a desired shape, so that the gate electrode 213 is formed.

The gate insulating film 214 can be formed using the material and stacked layer structure similar to those in Embodiment 2, and the manufacturing method shown in Embodiment 2. In this embodiment, a silicon oxynitride film with a thickness of 100 nm is used as the gate insulating film 204.

After a conductive film for a source electrode and a drain electrode is formed over the gate insulating film 214, the conductive film is patterned by etching or the like, so that the source electrode 216 and the drain electrode 217 are formed.

As a material of a conductive film for the source electrode and the drain electrode, for example, an element selected from titanium, tungsten, and molybdenum, an alloy containing one or more of the above elements, or the like can be used. In a semiconductor device of one embodiment of the present invention, in the source electrode 216 and the drain electrode 217, at least a portion which is the closest to the island-shaped oxide semiconductor film 215 to be formed later may be formed using an element selected from titanium, tungsten, and molybdenum, an alloy containing one or more of the above elements, or the like. Therefore, in the case where the source electrode 216 and the drain electrode 217 each having a structure in which a plurality of metal films are stacked, a metal film that is in contact with the oxide semiconductor film 215 may be formed using titanium, tungsten, or molybdenum, and the other metal films can be formed using any of the following examples: an element selected from aluminum, chromium, tantalum, titanium, manganese, magnesium, molybdenum, tungsten, zirconium, beryllium, and yttrium; an alloy containing one or more of the above elements as a component; a nitride containing the above element as a component; or the like. For example, by using a conductive film having a stacked structure of a titanium film, an aluminum alloy film containing neodymium, and a titanium film, and by using the titanium film in the portion which is the closest to the island-shaped oxide semiconductor film 215, the source electrode 216 and the drain electrode 217 can have a low resistance and high heat resistance in the aluminum alloy film containing neodymium.

Note that in the case where heat treatment is performed after the formation of the conductive film for the source electrode and the drain electrode, the conductive film preferably has heat resistance enough to withstand the heat treatment. In the case of performing heat treatment after the formation of the conductive film, the conductive film is formed in combination with the heat-resistant conductive material because aluminum alone has problems of low heat resistance, being easily corroded, and the like. As the heat-resistant conductive material which is combined with aluminum, the following material is preferably used: an element selected from titanium, tantalum, tungsten, molybdenum, chromium, neodymium, and scandium; an alloy containing one or more of these elements as a component; a nitride containing any of these elements as a component; or the like.

The source electrode 216 and the drain electrode 217 of a bottom-contact thin film transistor are preferably thinner than those of the bottom-gate transistor illustrated in Embodiment 2 in order to prevent breakage of the oxide semiconductor film 215 formed later. Specifically, the thicknesses of the source electrode 216 and the drain electrode 217 are 10 nm to 200 nm, preferably 50 nm to 75 nm. In this embodiment, after a conductive film for a source electrode and a drain electrode is formed by a sputtering method using a titanium target, the conductive film is processed (patterned) to have a desired shape by etching, so that the source electrode 216 and the drain electrode 217 are formed.

The island-shaped oxide semiconductor film 215 can be formed using a material similar to that in Embodiment 2 and the manufacturing method shown in Embodiment 2, so as to be in contact with the gate insulating film 214 in a position overlapping with the gate electrode 213 over the source electrode 216 and the drain electrode 217.

In this embodiment, as the oxide semiconductor film 215, an In—Ga—Zn—O-based non-single-crystal film with a thickness of 50 nm, which is obtained by a sputtering method using an oxide semiconductor target including indium (In), gallium (Ga), and zinc (Zn) ($In_2O_3$:$Ga_2O_3$:ZnO=1:1:1), is used.

By forming the oxide semiconductor film 215 having the above structure over the source electrode 216 and the drain electrode 217, oxygen in the region of the oxide semiconductor film 215 which is the closest to the source electrode 216 and the drain electrode 217 is taken out, so that the composite layers 260 where the concentration of a metal contained in the oxide semiconductor film 215 is higher than that in other regions (metal-rich layers) are formed in the oxide semiconductor film 215. The oxygen that is taken out reacts with the metal in the source electrode 216 and the drain electrode 217, so that the metal oxide films 261 are formed between the metal-rich composite layer 260 and the source electrode 216, and between the metal-rich composite layer 260 and the drain electrode 217. The thickness of the metal-rich composite layers 260 is more than or equal to 2 nm and less than or equal to 10 nm, and the thickness of the metal oxide films 261 is more than or equal to 2 nm and less than or equal to 10 nm.

For example, in the case where an In—Ga—Zn—O-based oxide semiconductor is used for the oxide semiconductor film 215, the composite layers 260 where the concentration of indium is higher than that in other regions (In-rich layers) exist in regions of the oxide semiconductor film 215 which are the closest to the source electrode 216 and the drain electrode 217, so that resistance of the In-rich composite layers 260 in the oxide semiconductor film 215 becomes lower. In the case where titanium is used for the source electrode 216 and the drain electrode 217, the metal oxide films 261 formed between the source electrode 216 and the oxide semiconductor film 215, and between the drain electrode 217 and the oxide semiconductor film 215 contain titanium oxide (TiOx) and have n-type conductivity. Therefore, with the above structure, contact resistance between the source electrode 216 and the oxide semiconductor film 215, and between the drain electrode 217 and the oxide semiconductor film 215 is reduced, and the amount of on-current and field effect mobility of a TFT can be increased.

The oxide insulating film 218 is formed to be in contact with the island-shaped oxide semiconductor film 215 by a sputtering method. The oxide insulating film 218 can be formed using the material and stacked layer structure similar to those in Embodiment 2, and the manufacturing method shown in Embodiment 2. In this embodiment, a silicon oxide film with a thickness of 300 nm is formed as the oxide insulating film 218.

Figure 12C:
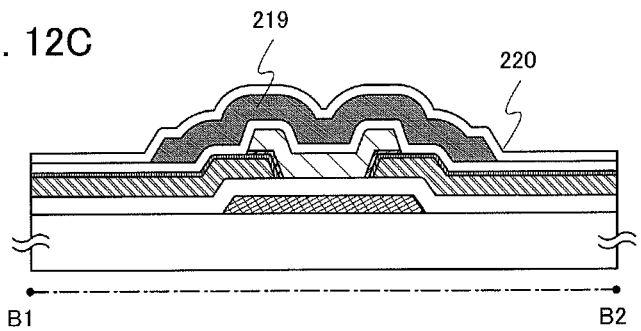

Note that as illustrated in FIG. 12C, the thin film transistor 211 may further include a conductive film 219 over the oxide insulating film 218. A material or stacked layer structure similar to that for the gate electrode 213 can be used for the conductive film 219. The thickness of the conductive film 219 is 10 nm to 400 nm, preferably 100 nm to 200 nm. A resist mask is formed by a photolithography method and a conductive film is processed (patterned) to have a desired shape. The conductive film 219 is formed so as to overlap with a channel formation region in the oxide semiconductor film 215. The conductive film 219 may be in a floating state, that is, electrically insulated, or may be in a state in which a potential is given. In the latter case, a potential having the same level as the gate electrode 213 or a fixed potential such as a ground potential may be given to the conductive film 219. By controlling the level of a potential given to the conductive film 219, the threshold voltage of the thin film transistor 211 can be controlled.

Further, in the case of forming the conductive film 219, an insulating film 220 is formed so as to cover the conductive film 219. The insulating film 220 is formed using an inorganic insulating film which contains as few impurities, e.g., moisture, hydrogen, and a hydroxy group, as possible and blocks entry of these impurities from the outside, such as a silicon oxide film, a silicon nitride oxide film, an aluminum oxide film, or an aluminum oxynitride film.

A thin film transistor using an oxide semiconductor has high mobility compared to a thin film transistor using amorphous silicon, and uniform element characteristics similar to those of a thin film transistor using amorphous silicon. Accordingly, an oxide semiconductor can be used for not only a pixel portion but also a semiconductor element which forms a driver circuit with higher driving frequency than the pixel portion. A system-on-panel can be realized without a process of crystallization or the like.

This embodiment can be implemented in combination with any of the above embodiments.

(Embodiment 4)

In this embodiment, a structure of a bottom-gate thin film transistor with a channel-protective structure which is different from that of the thin film transistor 201 illustrated in Embodiment 2 or the thin film transistor 211 illustrated in Embodiment 3 is described. For the same portions as those in Embodiment 2 or portions having functions similar to those in Embodiment 2, Embodiment 2 can be referred to, and repetitive description thereof is omitted.

Figure 13A:
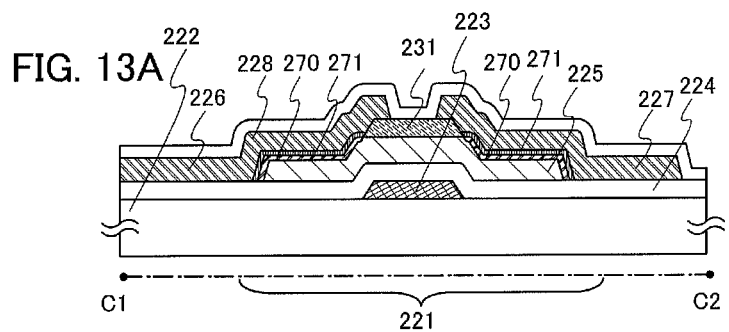
FIGS. 13A and 13C illustrate cross-sectional views of a transistor.
Figure 13B:
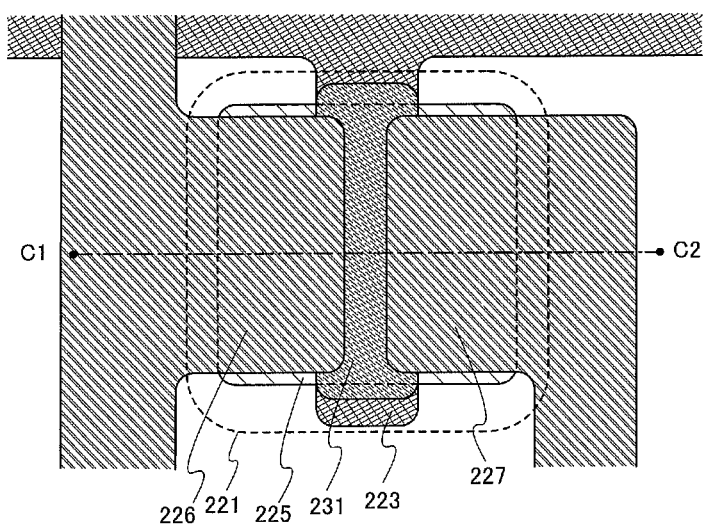
FIG. 13B illustrates a top view thereof.

FIG. 13A illustrates a cross-sectional view of a thin film transistor 221, and FIG. 13B illustrates a top view of the thin film transistor 221 illustrated in FIG. 13A. Note that a cross-sectional view taken along dashed line C1-C2 in FIG. 13B corresponds to FIG. 13A.

The thin film transistor 221 includes a gate electrode 223 formed over a substrate 222 having an insulating surface, a gate insulating film 224 over the gate electrode 223, an oxide semiconductor film 225 which overlaps with the gate electrode 223 over the gate insulating film 224 and which includes composite layers 270 where the concentration of one or a plurality of metals contained in the oxide semiconductor is higher than that in other regions, a pair of metal oxide films 271 formed over the oxide semiconductor film 225 and in contact with the composite layers 270, a source electrode 226 and a drain electrode 227 which are in contact with the metal oxide films 271, and a channel protective film 231 formed over the island-shaped oxide semiconductor film 225 in a position overlapping with the gate electrode 223. Further, the thin film transistor 221 may include as its component an oxide insulating film 228 formed over the oxide semiconductor film 225. The metal oxide films 271 are formed by oxidation of a metal contained in the source electrode 226 and the drain electrode 227.

An insulating film as a base film may be provided between the gate electrode 223 and the substrate 222. The base film can be formed using a material and a stacked layer structure similar to those in Embodiment 2. In addition, the gate electrode 223 can be formed using the material and stacked layer structure similar to those in Embodiment 2.

The thickness of the gate electrode 223 is 10 nm to 400 nm, preferably 100 nm to 200 nm. In this embodiment, after a conductive film with a thickness of 100 nm for the gate electrode is formed by a sputtering method using a tungsten target, the conductive film is processed (patterned) by etching to have a desired shape, so that the gate electrode 223 is formed.

The gate insulating film 224 can be formed using the material and stacked layer structure similar to those in Embodiment 2, and the manufacturing method shown in Embodiment 2. In this embodiment, a silicon oxynitride film with a thickness of 100 nm is used as the gate insulating film 224.

The island-shaped oxide semiconductor film 225 can be formed by using the same material as in Embodiment 2 and the method described in Embodiment 2, over the gate insulating film 224 in a position which overlaps with the gate electrode 223.

In this embodiment, as the oxide semiconductor film 225, an In—Ga—Zn—O-based non-single-crystal film with a thickness of 50 nm, which is obtained by a sputtering method using an oxide semiconductor target including indium (In), gallium (Ga), and zinc (Zn) ($In_2O_3:Ga_2O_3:ZnO=1:1:1$), is used.

The channel protective film 231 is formed over the island-shaped oxide semiconductor film 225 in a position of the island-shaped oxide semiconductor film 225 which overlaps with a portion to be a channel formation region, i.e., a position which overlaps with the gate electrode 223. The channel protective film 231 can prevent the portion of the oxide semiconductor film 225, which serves as a channel formation region later, from being damaged in a later step (for example, reduction in thickness due to plasma or an etchant in etching). Therefore, reliability of the thin film transistor can be improved.

The channel protective film 231 can be formed using an inorganic material that contains oxygen (e.g., silicon oxide, silicon nitride oxide, silicon oxynitride, aluminum oxide, or aluminum oxynitride). The channel protective film 231 can be formed by a vapor deposition method such as a plasma CVD method or a thermal CVD method, or a sputtering method. After the formation of the channel protective film 231, the shape thereof is processed by etching. Here, the channel protective film 231 is formed in such a manner that a silicon oxide film is formed by a sputtering method and processed by etching using a mask formed by photolithography.

When the channel protective film 231, which is an oxide insulating film, is formed to be in contact with the island-shaped oxide semiconductor film 225 by a sputtering method, a PCVD method, or the like, oxygen is supplied from the channel protective film 231. Carrier concentration at least in a region of the island-shaped oxide semiconductor film 225 in contact with the channel protective film 231 is preferably lowered to less than $1\times10^{18}/cm^3$, more preferably equal to or less than $1\times10^{14}/cm^3$, and resistance becomes higher, resulting in a high-resistance oxide semiconductor region. By formation of the channel protective film 231, the oxide semiconductor film 225 can have the high-resistance oxide semiconductor region in the vicinity of the interface between the oxide semiconductor film 225 and the channel protective film 231.

After a conductive film for a source electrode and a drain electrode is formed over the island-shaped oxide semiconductor film 225 and the channel protective film 231, the conductive film is patterned by etching or the like, so that the source electrode 226 and the drain electrode 227 are formed.

As a material of a conductive film for the source electrode and the drain electrode, for example, an element selected from titanium, tungsten, and molybdenum, an alloy containing one or more of the above elements, or the like can be used. In a semiconductor device of one embodiment of the present invention, in the source electrode 226 and the drain electrode 227, at least a portion which is the closest to the island-shaped oxide semiconductor film 225 may be formed using an element selected from titanium, tungsten, and molybdenum, an alloy containing one or more of the above elements, or the like. Therefore, in the case where the source electrode 226 and the drain electrode 227 each having a structure in which a plurality of metal films are stacked, a metal film that is in contact with the oxide semiconductor film 225 may be formed using titanium, tungsten, or molybdenum, and the other metal films can be formed using any of the following examples: an element selected from aluminum, chromium, tantalum, titanium, manganese, magnesium, molybdenum, tungsten, zirconium, beryllium, and yttrium; an alloy containing one or more of the above elements as a component; a nitride containing the above element as a component; or the like. For example, by using a conductive film having a stacked structure of a titanium film, an aluminum alloy film containing neodymium, and a titanium film, and by using the titanium film in the portion which is the closest to the island-shaped oxide semiconductor film 225, the source electrode 226 and the drain electrode 227 can have a low resistance and high heat resistance in the aluminum alloy film containing neodymium.

Note that in the case where heat treatment is performed after the formation of the conductive film for the source electrode and the drain electrode, the conductive film preferably has heat resistance enough to withstand the heat treatment. In the case of performing heat treatment after the formation of the conductive film, the conductive film is formed in combination with the heat-resistant conductive material because aluminum alone has problems of low heat resistance, being easily corroded, and the like. As the heat-resistant conductive material which is combined with aluminum, the following material is preferably used: an element selected from titanium, tantalum, tungsten, molybdenum, chromium, neodymium, and scandium; an alloy containing one or more of these elements as a component; a nitride containing any of these elements as a component; or the like.

The thickness of the conductive film for the source electrode and the drain electrode is 10 nm to 400 nm, preferably 100 nm to 200 nm. In this embodiment, after the conductive film for the source electrode and the drain electrode is formed by a sputtering method using a titanium target, the conductive film is processed (patterned) by etching to have a desired shape, so that the source electrode 226 and the drain electrode 227 are formed.

By forming the source electrode 226 and the drain electrode 227 having the above structure, oxygen in the region of the oxide semiconductor film 225 which is the closest to the source electrode 226 and the drain electrode 227 is taken out, so that the composite layers 270 where the concentration of a metal contained in the oxide semiconductor film 225 is higher than that in other regions (metal-rich layers) are formed in the oxide semiconductor film 225. The oxygen that is taken out reacts with the metal in the source electrode 226 and the drain electrode 227, so that the metal oxide films 271 are formed between the metal-rich composite layer 270 and the source electrode 226, and between the metal-rich composite layer 270 and the drain electrode 227. The thickness of the metal-rich composite layers 270 is more than or equal to 2 nm and less than or equal to 10 nm, and the thickness of the metal oxide films 271 is more than or equal to 2 nm and less than or equal to 10 nm.

For example, in the case where an In—Ga—Zn—O-based oxide semiconductor is used for the oxide semiconductor film 225, the composite layers 270 where the concentration of indium is higher than that in other regions (In-rich layers) exist in regions of the oxide semiconductor film 225 which are the closest to the source electrode 226 and the drain electrode 227, so that resistance of the In-rich composite layers 270 in the oxide semiconductor film 225 becomes lower. In the case where titanium is used for the source electrode 226 and the drain electrode 227, the metal oxide films 271 formed between the source electrode 226 and the oxide semiconductor film 225, and between the drain electrode 227 and the oxide semiconductor film 225 contain titanium oxide (TiOx) and have n-type conductivity. Therefore, with the above structure, contact resistance between the source electrode 226 and the oxide semiconductor film 225, and between the drain electrode 227 and the oxide semiconductor film 225 is reduced, and the amount of on-current and field effect mobility of a TFT can be increased.

The oxide insulating film 228 is formed to be in contact with the source electrode 226 and the drain electrode 227 by a sputtering method. The oxide insulating film 228 can be formed using the material and stacked layer structure similar to those in Embodiment 2, and the manufacturing method shown in Embodiment 2. Note that when the channel protective film 231 is formed, the oxide insulating film 228 is not necessarily formed.

Figure 13C:
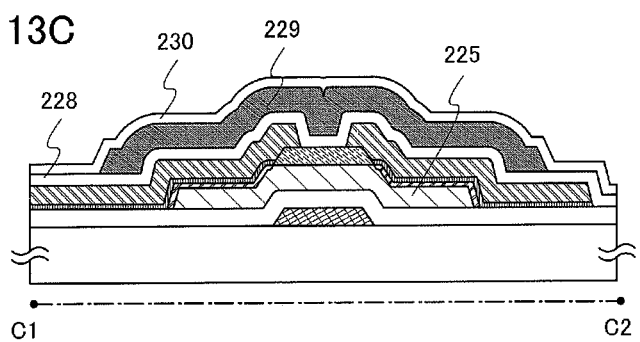

Note that as illustrated in FIG. 13C, the thin film transistor 221 may further include a conductive film 229 over the oxide insulating film 228. A material or stacked layer structure similar to that for the gate electrode 223 can be used for the conductive film 229. The thickness of the conductive film 229 is 10 nm to 400 nm, preferably 100 nm to 200 nm. A resist mask is formed by a photolithography method and a conductive film is processed (patterned) to have a desired shape. The conductive film 229 is formed so as to overlap with a channel formation region in the oxide semiconductor film 225. The conductive film 229 may be in a floating state, that is, electrically insulated, or may be in a state in which a potential is given. In the latter case, a potential having the same level as the gate electrode 223 or a fixed potential such as a ground potential may be given to the conductive film 229. By controlling the level of a potential given to the conductive film 229, the threshold voltage of the thin film transistor 221 can be controlled.

Further, in the case of forming the conductive film 229, an insulating film 230 is formed so as to cover the conductive film 229. The insulating film 230 is formed using an inorganic insulating film which contains as few impurities, e.g., moisture, hydrogen, and a hydroxy group, as possible and blocks entry of these impurities from the outside, such as a silicon oxide film, a silicon nitride oxide film, an aluminum oxide film, or an aluminum oxynitride film.

A thin film transistor using an oxide semiconductor has high mobility compared to a thin film transistor using amorphous silicon, and uniform element characteristics similar to those of a thin film transistor using amorphous silicon. Accordingly, an oxide semiconductor can be used for not only a pixel portion but also a semiconductor element which forms a driver circuit with higher driving frequency than the pixel portion. A system-on-panel can be realized without a process of crystallization or the like.

This embodiment can be implemented in combination with any of the above embodiments.

(Embodiment 5)

In this embodiment, a structure of a semiconductor display device referred to as an electronic paper or a digital paper, which is a semiconductor display device of the present invention, is described.

A display element which can control a grayscale by voltage application and has a memory property is used for the electronic paper. Specifically, in the display element used for the electric paper, a display element such as a non-aqueous electrophoretic display element; a display element which uses a PDLC (polymer dispersed liquid crystal) method, in which liquid crystal droplets are dispersed in a high polymer material which is between two electrodes; a display element which includes chiral nematic liquid crystal or cholesteric liquid crystal between two electrodes; a display element which includes charged fine particles between two electrodes and employs a particle-moving method in which the charged fine particles are moved through fine particles by using an electric field; or the like can be used. Further, a non-aqueous electrophoretic display element may be a display element in which a dispersion liquid in which charged fine particles are dispersed is interposed between two electrodes; a display element in which a dispersion liquid in which charged fine particles are dispersed is included over two electrodes between which an insulating film is interposed; a display element in which twisting balls having hemispheres which are different colors which charge differently are dispersed in a solvent between two electrodes; a display element which includes microcapsules in which a plurality of charged fine particles are dispersed in a solution, between two electrodes; or the like.

Figure 14A:
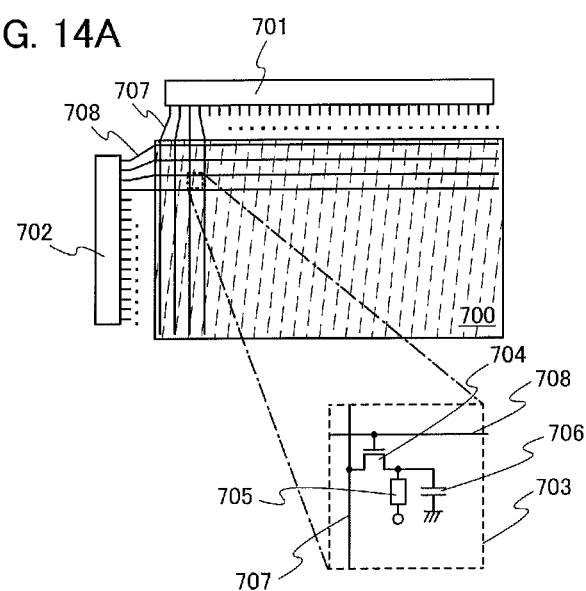
FIGS. 14A and 14B respectively illustrate a top view and a cross-sectional view of an electronic paper.

FIG. 14A illustrates a top view of a pixel portion 700, a signal line driver circuit 701, and a scan line driver circuit 702 of an electronic paper.

The pixel portion 700 includes a plurality of pixels 703. Further, a plurality of signal lines 707 are led into the pixel portion 700 from the signal line driver circuit 701. A plurality of scan lines 708 are led into the pixel portion 700 from the scan line driver circuit 702.

Each of the pixels 703 includes a transistor 704, a display element 705, and a storage capacitor 706. A gate electrode of the transistor 704 is connected to one of the scan lines 708. Further, one of a source electrode and a drain electrode of the transistor 704 is connected to one of the signal lines 707 and the other of the source electrode and the drain electrode of the transistor 704 is connected to a pixel electrode of the display element 705.

Note that in FIG. 14A, the storage capacitor 706 is connected in parallel to the display element 705 so that a voltage applied between the pixel electrode and a counter electrode of the display element 705 is stored; however, in the case where the memory property of the display element 705 is so high that display can be maintained, the storage capacitor 706 is not necessarily provided.

Note that although a structure of an active matrix pixel portion in which one transistor which serves as a switching element is provided in each pixel is described in FIG. 14A, the electric paper which is one embodiment of the invention is not limited to this structure. A plurality of transistors may be provided in each pixel. Further, in addition to transistors, elements such as capacitors, resistors, coils, or the like may also be connected.

Figure 14B:
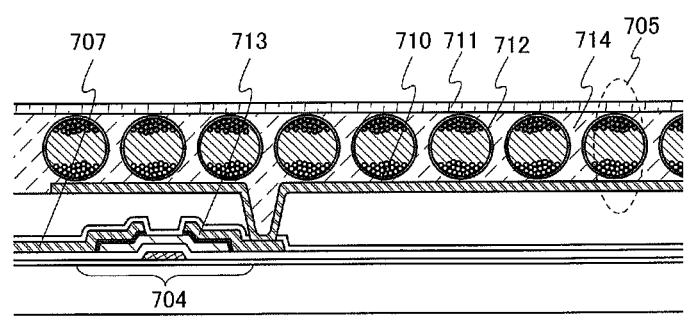

An electronic paper of an electrophoretic system including microcapsules is given as one example. FIG. 14B illustrates a cross-sectional view of the display element 705 provided for each of the pixels 703.

The display element 705 includes a pixel electrode 710, a counter electrode 711, and microcapsules 712 to which a voltage is applied by the pixel electrode 710 and the counter electrode 711. Either the source electrode or the drain electrode 713 of a transistor 704 is connected to the pixel electrode 710.

In the microcapsules 712, positively charged white pigment such as titanium oxide and negatively charged black pigment such as carbon black are sealed together with a dispersion medium such as oil. A voltage is applied between the pixel electrode and the counter electrode in accordance with the voltage of a video signal applied to the pixel electrode 710, and black pigment and white pigment are drawn to a positive electrode side and a negative electrode side, respectively. Thus, the grayscale can be displayed.

Further, in FIG. 14B, the microcapsules 712 are fixed by light-transmitting resin 714 between the pixel electrode 710 and the counter electrode 711. However, the present invention is not limited to this structure. A space formed by the microcapsules 712, the pixel electrode 710, and the counter electrode 711 may be filled with gas such as inert gas or air. Note that in this case, the microcapsules 712 is preferably fixed to both or either the pixel electrode 710 and/or the counter electrode 711 by an adhesive or the like.

In addition, the number of the microcapsules 712 included in the display element 705 is not necessarily plural as in FIG. 14B. One display element 705 may include a plurality of microcapsules 712 or a plurality of display elements 705 may include one microcapsule 712. For example, two display elements 705 share one microcapsule 712, and a positive voltage and a negative voltage are applied to the pixel electrode 710 included in one of the display elements 705 and the pixel electrode 710 included in the other of the display elements 705, respectively. In this case, in the microcapsule 712 in a region overlapping with the pixel electrode 710 to which a positive voltage is applied, black pigment is drawn to the pixel electrode 710 side and white pigment is drawn to the counter electrode 711 side. In contrast, in the microcapsule 712 in a region overlapping with the pixel electrode 710 to which a negative voltage is applied, white pigment is drawn to the pixel electrode 710 side and black pigment is drawn to the counter electrode 711 side.

Next, a specific driving method of an electronic paper is described by taking an example of the above electronic paper of the electrophoretic system.

Operation of the electronic paper in an initialization period, a writing period, and a holding period can be separately described.

First, in the initialization period before a display image is switched, the grayscale levels of each of the pixels in a pixel portion are temporarily set to be equal in order to initialize display elements. Initialization of the gray scale level prevents an afterimage. Specifically, in an electrophoretic system, displayed grayscale level is adjusted by the microcapsule 712 included in the display element 705 such that the display of each pixel is white or black.

In this embodiment, an operation of initialization in the case where after an initialization video signal for displaying black is inputted to a pixel, an initialization video signal for displaying white is inputted to a pixel is described. For example, when the electronic paper of an electrophoretic system in which display of an image is performed toward the counter electrode 711 side, a voltage is applied to the display element 705 such that black pigment in the microcapsule 712 moves to the counter electrode 711 side and white pigment in the microcapsule 712 moves to the pixel electrode 710 side. Next, a voltage is applied to the display element 705 such that white pigment in the microcapsule 712 moves to the counter electrode 711 side and black pigment in the microcapsule 712 moves to the pixel electrode 710 side.

Further, depending on the grayscale level displayed before the initialization period, only one-time input of an initialization video signal to the pixel could possibly stop the move of white pigment and black pigment in the microcapsule 712 and cause a difference between displayed grayscale levels of pixels even after the initialization period ends. Therefore, it is preferable that a negative voltage −Vp with respect to a common voltage Vcom be applied to the pixel electrode 710 a plurality of times so that black is displayed and a positive voltage Vp with respect to the common voltage Vcom be applied to the pixel electrode 710 a plurality of times so that white is displayed.

Note that when grayscale levels displayed before the initialization period differ depending on display elements of each of the pixels, the minimum number of times for inputting an initialization video signal also varies. Accordingly, the number of times for inputting an initialization video signal may be changed between pixels in accordance with a grayscale level displayed before the initialization period. In this case, the common voltage Vcom is preferably inputted to a pixel to which the initialization video signal is not necessarily inputted.

Note that in order for the voltage Vp or the voltage −Vp which is an initialization video signal to be applied to the pixel electrode 710 a plurality of times, the following operation sequence is performed a plurality of times: the initialization video signal is inputted to a pixel of a line including the scan line in a period during which a pulse of a selection signal is supplied to each scan line. The voltage Vp or the voltage −Vp of an initialization video signal is applied to the pixel electrode 710 a plurality of times, whereby movement of white pigment and black pigment in the microcapsule 712 converges in order to prevent generation of a difference of grayscale levels between pixels. Thus, initialization of a pixel in the pixel portion can be performed.

Note that in each pixel in the initialization period, the case where black is displayed after white as well as the case where white is displayed after black is acceptable. Alternatively, in each pixel in the initialization period, the case where black is displayed after white is displayed; and further, after that white is displayed is also acceptable.

Further, as for all of the pixels in the pixel portion, timing of starting the initialization period is not necessarily the same. For example, timing of starting the initialization period may be different for every pixel, or every pixel belonging to the same line, or the like.

Next in the writing period, a video signal having image data is inputted to the pixel.

In the case where an image is displayed on the entire pixel portion, in one frame period, a selection signal in which a pulse of voltage is shifted is sequentially inputted to all of the scan lines. Then, in one line period in which a pulse appears in a selection signal, a video signal having image data is inputted to all of the signal line.

White pigment and black pigment in the microcapsule 712 are moved to the pixel electrode 710 side and the counter electrode 711 in accordance with the voltage of the video signal applied to the pixel electrode 710, so that the display element 705 displays a grayscale.

Note that also in the writing period, the voltage of a video signal is preferably applied to the pixel electrode 710 a plurality of times as in the initialization period. Accordingly, the following operation sequence is performed a plurality of times: the video signal is inputted to a pixel of a line including the scan line in a period during which a pulse of a selection signal is supplied to each scan line.

Next, in the holding period, after the common voltage Vcom is inputted to all of the pixels through signal lines, a selection signal is not inputted to a scan line, or a video signal is not inputted to a signal line. Accordingly, the positions of white pigment and black pigment in the microcapsule 712 included in the display element 705 is maintained unless a positive or negative voltage is applied between the pixel electrode 710 and the counter electrode 711, so that the grayscale level displayed on the display element 705 is held. Therefore, an image written in the writing period is maintained even in the holding period.

Note that a voltage needed for changing gray scales of the display element used for an electric paper tends to be higher than that of a liquid crystal element used for a liquid crystal display device or that of a light-emitting element such as an organic light-emitting element used for a light-emitting device. Therefore, the potential difference between the source electrode and the drain electrode of the transistor 704 of a pixel serving for a switching element in a writing period is large; as a result, off-current is increased, and disturbance of display is likely to occur due to fluctuation of potentials of the pixel electrode 710. In order to prevent fluctuation of potentials of the pixel electrode 710 caused by the off-current of the transistor 704, it is effective to increase capacitance of the storage capacitor 706. In addition, noise of display by the display element 705 can occur in some cases by not only a voltage between the pixel electrode 710 and the counter electrode 711, but also a voltage generated between the signal line 707 and the counter electrode 711 being applied to microcapsules 712. In order to prevent the noise, it is effective to secure a large area of the pixel electrode 710 and prevent the voltage generated between the signal line 707 and the counter electrode 711 from being applied to the microcapsules 712. However, as described above, when capacitance of the storage capacitor 706 is increased in order to prevent fluctuations of potentials of the pixel electrode 710, or when the area of the pixel electrode 710 is increased in order to prevent the noise of display, the value of current to be supplied to a pixel in a wiring period becomes high, resulting in a longer time for input of a video signal. In an electric paper of one embodiment of the present invention, since the transistor 704 used for a pixel as a switching element has high field effect mobility, a high on-current can be obtained. As a result, even when the capacitance of the storage capacitor 706 is increased, or even when the area of the pixel electrode 710 is increased, a video signal can be rapidly input to a pixel. Therefore, the length of the writing time can be suppressed, and displayed images can be smoothly switched.

This embodiment can be implemented in combination with any of the above embodiments.

(Embodiment 6)

Figure 15A:
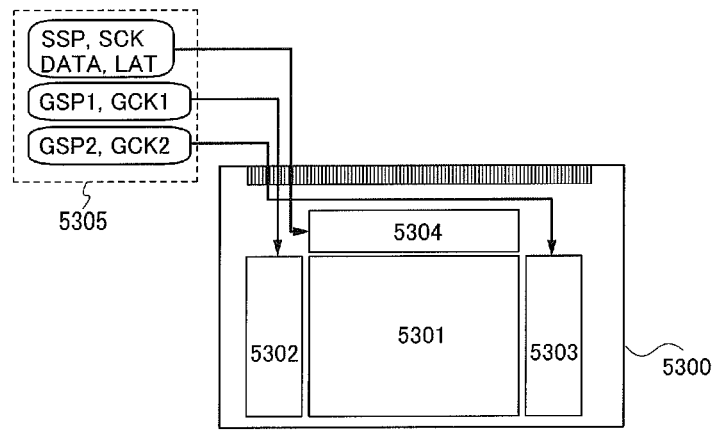
FIGS. 15A and 15B illustrate block diagrams of semiconductor display devices.

FIG. 15A is an example of a block diagram of an active matrix semiconductor display device. Over a substrate 5300 in the display device, a pixel portion 5301, a first scan line driver circuit 5302, a second scan line driver circuit 5303, and a signal line driver circuit 5304 are provided. In the pixel portion 5301, a plurality of signal lines extended from the signal line driver circuit 5304 is arranged and a plurality of scan lines extended from the first scan line driver circuit 5302 and the second scan line driver circuit 5303 is arranged. Note that pixels which include display elements are provided in a matrix in respective regions where the scan lines and the signal lines intersect with each other. Further, the substrate 5300 in the display device is connected to a timing control circuit 5305 (also referred to as a controller or a controller IC) through a connection portion such as a flexible printed circuit (FPC).

In FIG. 15A, the first scan line driver circuit 5302, the second scan line driver circuit 5303, and the signal line driver circuit 5304 are provided over the same substrate 5300 as the pixel portion 5301. Therefore, since the number of components provided outside such as a driver circuit is reduced, it is possible not only to downsize the display device but also to reduce cost due to decrease in the number of assembly steps and inspection steps. Further, if the driver circuit is provided outside the substrate 5300, wirings would need to be extended and the number of connections of wirings would be increased, but by providing the driver circuit over the substrate 5300, the number of connections of the wirings can be reduced. Therefore, decrease in yield due to defective connection of the driver circuit and the pixel portion can be prevented, and decrease in reliability due to low mechanical strength at a connection portion can be prevented.

Note that as an example, the timing control circuit 5305 supplies a first scan line driver circuit start signal (GSP1) and a scan line driver circuit clock signal (GCK1) to the first scan line driver circuit 5302. Moreover, as an example, the timing control circuit 5305 supplies a second scan line driver circuit start signal (GSP2) (also referred to as a start pulse) and a scan line driver circuit clock signal (GCK2) to the second scan line driver circuit 5303. The timing control circuit 5305 supplies a signal line driver circuit start signal (SSP), a signal line driver circuit clock signal (SCK), video signal data (DATA) (also simply referred to as a video signal) and a latch signal (LAT) to the signal line driver circuit 5304. Note that each clock signal may be a plurality of clock signals whose periods are different or may be supplied together with an inverted clock signal (CKB). Either the first scan line driver circuit 5302 or the second scan line driver circuit 5303 can be omitted.

Figure 15B:
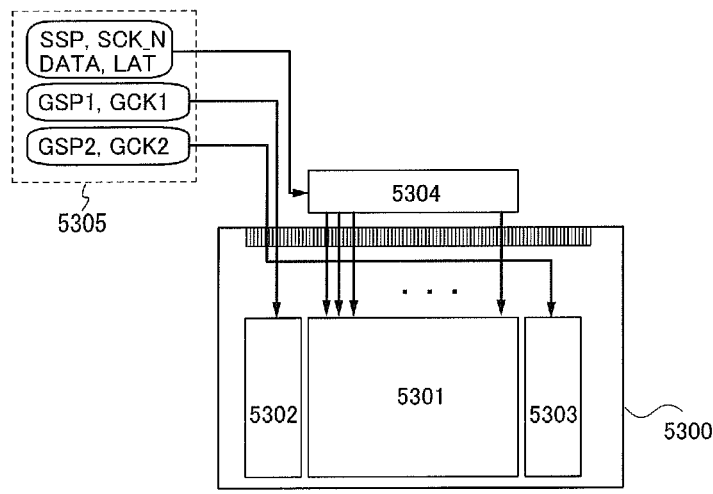

In FIG. 15B, a circuit with a low drive frequency (e.g., the first scan line driver circuit 5302 and the second scan line driver circuit 5303) is formed over the same substrate 5300 as the pixel portion 5301, and the signal line driver circuit 5304 is formed over another substrate which is different from the substrate provided with the pixel portion 5301. It is also possible to form a circuit with a low drive frequency such as an analog switch used for a sampling circuit in the signal line driver circuit 5304 partly over the same substrate 5300 as the pixel portion 5301. Thus, by partly employing system-on-panel, advantages of system-on-panel such as the above-described prevention of decrease in yield due to defective connection, or low mechanical strength at a connection portion, and reduction in cost due to decrease in the number of assembly steps and inspection steps can be obtained more or less. Further, as compared with system-on-panel in which the pixel portion 5301, the first scan line driver circuit 5302, the second scan line driver circuit 5303, and the signal line driver circuit 5304 are formed over one substrate, by partly employing system-on-panel, it is possible to increase performance of a circuit with a high drive frequency. Moreover, formation of a pixel portion having a large area is possible, which is difficult to realize in the case of using a single crystal semiconductor.

Next, a structure of a signal line driver circuit including an n-channel transistor is described.

Figure 16A:
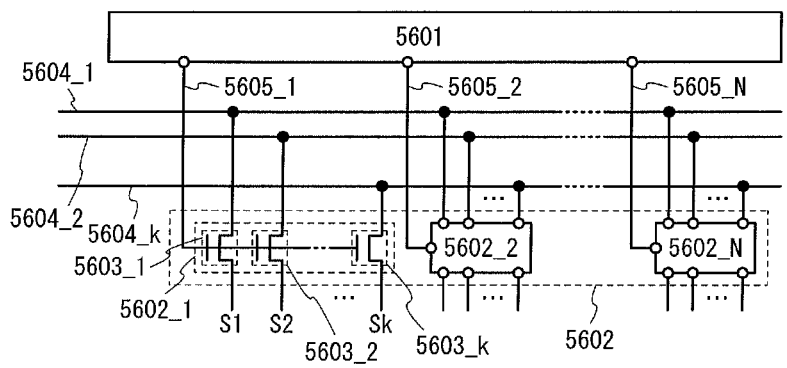
FIGS. 16A and 16B illustrate configuration of a signal line driver circuit and a timing chart thereof.

The signal line driver circuit illustrated in FIG. 16A includes a shift register 5601 and a sampling circuit 5602. The sampling circuit 5602 includes a plurality of switching circuits 5602_1 to 5602_N (N is a natural number). The switching circuits 5602_1 to 5602_N each include a plurality of n-channel transistors 5603_1 to 5603_$k$ ($k$ is a natural number).

A connection relation in the signal line driver circuit is described by using the switching circuit 5602_1 as an example. Note that one of a source electrode and a drain electrode included in a transistor is referred to as a first terminal, and the other of the source electrode and the drain electrode is referred to as a second terminal in the description below.

First terminals of the transistors 5603_1 to 5603_k are connected to wirings 5604_1 to 5604_k, respectively. The video signal is input to each of the wirings 5604_1 to 5604_k. Second terminals of the thin film transistors 5603_1 to 5603_k are connected to signal lines S1 to Sk, respectively. Gate electrodes of the thin film transistors 5603_1 to 5603_k are connected to a wiring 5605_1.

The shift register 5601 has the function of sequentially selecting the switching circuits 5602_1 to 5602_N by sequentially outputting timing signals having a high voltage level (H level) to wirings 5605_1 to 5605_N.

The switching circuit 5602_1 has a function of controlling a conduction state between the wirings 5604_1 to 5604_k and the signal lines S1 to Sk (a conduction state between the first terminal and the second terminal), i.e., a function of controlling whether or not to supply potentials of the wirings 5604_1 to 5604_k to the signal lines S1 to Sk by switching of the transistors 5603_1 to 5603_N.

Figure 16B:
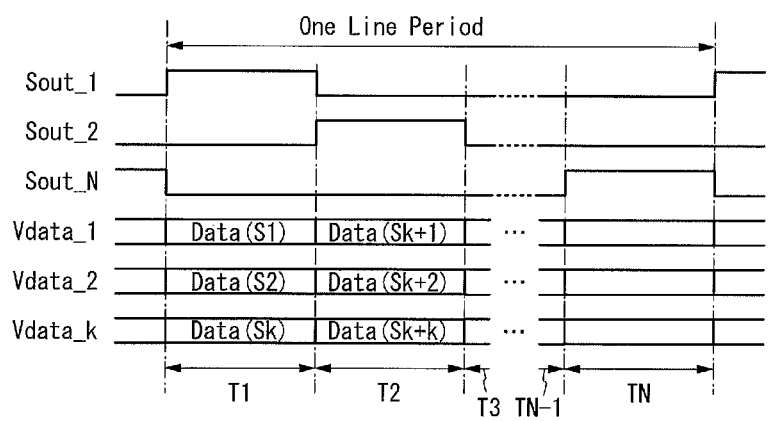

Next, operation of the signal line driver circuit shown in FIG. 16A is described with reference to a timing chart in FIG. 16B. FIG. 16B illustrates a timing chart of timing signals Sout_1 to Sout_N respectively inputted to the wirings 5605_1 to 5605_N and video signals Vdata_1 to Vdata_k respectively inputted to the wirings 5604_1 to 5604_k from the shift register 5601, as one example.

Note that one operation period of the signal line driver circuit corresponds to one line period in a display device. FIG. 16B illustrates one example of the case where one line period is divided into periods T1 to TN. Each of the periods T1 to TN is a period for writing a video signal to one pixel belonging to the selected row.

In the periods T1 to TN, the shift register 5601 sequentially outputs H-level timing signals to the wirings 5605_1 to 5605_N. For example, in the period T1, the shift register 5601 outputs an H-level signal to the wiring 5605_1. Then, the thin film transistors 5603_1 to 5603_k included in the switching circuit 5602_1 are turned on, so that the wirings 5604_1 to 5604_k and the signal lines S1 to Sk are brought into conduction. In this case, Data (S1) to Data (Sk) are input to the wirings 5604_1 to 5604_k, respectively. The Data (S1) to Data (Sk) are input to pixels in the first to k-th columns in the selected row through the transistors 5603_1 to 5603_k. Thus, in the periods T1 to TN, video signals are sequentially written to the pixels in the selected row by k columns.

By writing video signals to pixels of every plurality of columns, the number of video signals or the number of wirings can be reduced. Thus, connections to an external circuit such as a controller can be reduced. By writing video signals to pixels of every plurality of columns, writing time can be extended and insufficient writing of video signals can be prevented.

Next, one mode of a shift register used for the signal line driver circuit or the scan line driver circuit will be described with reference to FIGS. 17A and 17B and FIGS. 18A and 18B.

Figure 17A:
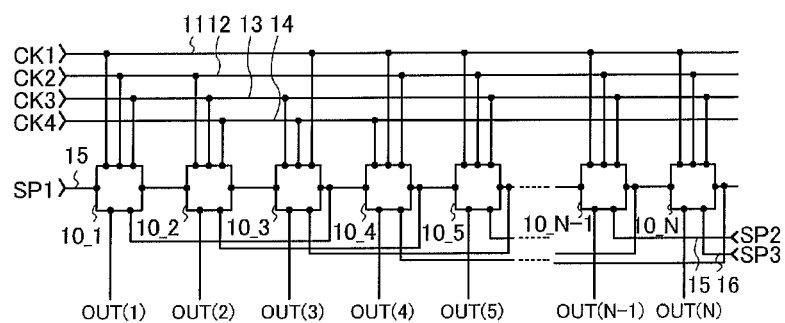
FIGS. 17A and 17B are circuit diagrams showing a structure of a shift register.

The shift register includes first to N-th pulse output circuits 10_1 to 10_N (N is a natural number of greater than or equal to 3) (see FIG. 17A). A first clock signal CK1, a second clock signal CK2, a third clock signal CK3, and a fourth clock signal CK4 are supplied from a first wiring 11, a second wiring 12, a third wiring 13, and a fourth wiring 14, respectively, to the first to Nth pulse output circuits 10_1 to 10_N. A start pulse SP1 (a first start pulse) from a fifth wiring 15 is input to the first pulse output circuit 10_1. A signal from a pulse output circuit of the previous stage (also referred to as a previous stage signal OUT (n−1) (n is a natural number of greater than or equal to 2) is input to the n-th pulse output circuit 10_n (n is a natural number of greater than or equal to 2 and less than or equal to N) of the second and subsequent stages. To the first pulse output circuit 10_1, a signal from the third pulse output circuit 10_3 of a stage following the next stage is input. Similarly, to the n-th pulse output circuit 10_n of the second or subsequent stage, a signal from the (n+2)th pulse output circuit 10_($n+2$) of the stage following the next stage (such a signal is referred to as a subsequent-stage signal OUT(n+2)) is input. Therefore, from the pulse output circuits of the respective stages, first output signals (OUT(1)(SR) to OUT(N)(SR)) to be input to the pulse output circuits of the subsequent stages and/or the stages before the preceding stages and second output signals (OUT(1) to OUT(N)) to be input to different circuits or the like are output. Since later-stage signals OUT(n+2) are not input to the pulse output circuits in the last two stages of the shift register, a structure in which a second start pulse SP2 and a third start pulse SP3 are input to the respective pulse output circuits may be employed, for example, as shown in FIG. 17A.

Note that a clock signal (CK) alternates between an H level and an L level (low level voltage) at regular intervals. The first to the fourth clock signals (CK1) to (CK4) are delayed by ¼ period sequentially. In this embodiment, by using the first to fourth clock signals (CK1) to (CK4), control or the like of driving of a pulse output circuit is performed.

A first input terminal 21, a second input terminal 22, and a third input terminal 23 are electrically connected to any of the first to fourth wirings 11 to 14. For example, in FIG. 17A, the first input terminal 21 of the first pulse output circuit 10_1 is electrically connected to the first wiring 11, the second input terminal 22 of the first pulse output circuit 10_1 is electrically connected to the second wiring 12, and the third input terminal 23 of the first pulse output circuit 10_1 is electrically connected to the third wiring 13. In addition, the first input terminal 21 of the second pulse output circuit 10_2 is electrically connected to the second wiring 12, the second input terminal 22 of the second pulse output circuit 10_2 is electrically connected to the third wiring 13, and the third input terminal 23 of the second pulse output circuit 10_2 is electrically connected to the fourth wiring 14.

Figure 17B:
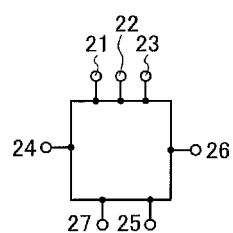

Each of the first to N-th pulse output circuits 10_1 to 10_N includes the first input terminal 21, the second input terminal 22, the third input terminal 23, a fourth input terminal 24, a fifth input terminal 25, a first output terminal 26, and a second output terminal 27 (see FIG. 17B). In the first pulse output circuit 10_1, the first clock signal CK1 is input to the first input terminal 21; the second clock signal CK2 is input to the second input terminal 22; the third clock signal CK3 is input to the third input terminal 23; the start pulse is input to the fourth input terminal 24; the next stage signal OUT (3) is input to the fifth input terminal 25; the first output signal OUT (1) (SR) is output from the first output terminal 26; and the second output signal OUT (1) is output from the second output terminal 27.

Figure 18A:
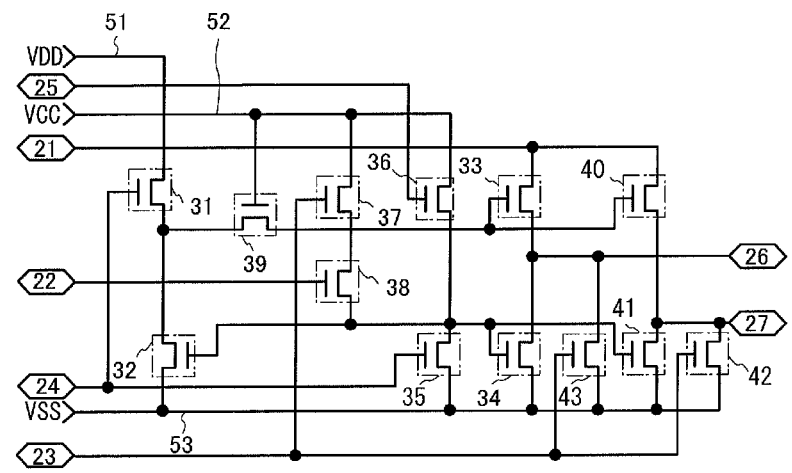
FIGS. 18A and 18B respectively show a circuit diagram and a timing chart of operation of a shift register.

Next, FIG. 18A illustrates one example of a specific circuit structure of a pulse output circuit.

The pulse output circuits each include first to thirteenth transistors 31 to 43 (see FIG. 18A). Signals or power supply potentials are supplied to the first to thirteenth transistors 31 to 43 from a power supply line 51 which supplies a first high power supply potential VDD, a power supply line 52 which supplies a second high power supply potential VCC, and a power supply line 53 which supplies a low power supply potential VSS, in addition to the above-described first to fifth input terminals 21 to 25, the first output terminal 26, and the second output terminal 27. Here, the relation of the power supply potentials of the power supply lines in FIG. 18A is as follows: a first power supply potential VDD is higher than a second power supply potential VCC, and the second power supply potential VCC is higher than a third power supply potential VSS. The first to fourth clock signals (CK1) to (CK4) alternate between H-level signals and L-level signals at regular intervals. The potential is VDD when the clock signal is at the H level, and the potential is VSS when the clock signal is at the L level. By making the potential VDD of the power supply line 51 higher than the second power supply potential VCC of the power supply line 52, a potential applied to a gate electrode of a transistor can be lowered, shift in the threshold voltage of the transistor can be reduced, and deterioration of the transistor can be suppressed without an adverse effect on the operation of the transistor.

In FIG. 18A, a first terminal of the first transistor 31 is electrically connected to the power supply line 51, a second terminal of the first transistor 31 is electrically connected to a first terminal of the ninth transistor 39, and a gate electrode of the first transistor 31 is electrically connected to the fourth input terminal 24. A first terminal of the second transistor 32 is electrically connected to the power supply line 53, a second terminal of the second transistor 32 is electrically connected to the first terminal of the ninth transistor 39, and a gate electrode of the second transistor 32 is electrically connected to a gate electrode of the fourth transistor 34. A first terminal of the third transistor 33 is electrically connected to the first input terminal 21, and a second terminal of the third transistor 33 is electrically connected to the first output terminal 26. A first terminal of the fourth transistor 34 is electrically connected to the power supply line 53, and a second terminal of the fourth transistor 34 is electrically connected to the first output terminal 26. A first terminal of the fifth transistor 35 is electrically connected to the power supply line 53, a second terminal of the fifth transistor 35 is electrically connected to the gate electrode of the second transistor 32 and the gate electrode of the fourth transistor 34, and a gate electrode of the fifth transistor 35 is electrically connected to the fourth input terminal 24. A first terminal of the sixth transistor 36 is electrically connected to the power supply line 52, a second terminal of the sixth transistor 36 is electrically connected to the gate electrode of the second transistor 32 and the gate electrode of the fourth transistor 34, and a gate electrode of the sixth transistor 36 is electrically connected to the fifth input terminal 25. A first terminal of the seventh transistor 37 is electrically connected to the power supply line 52, a second terminal of the seventh transistor 37 is electrically connected to a second terminal of the eighth transistor 38, and a gate electrode of the seventh transistor 37 is electrically connected to the third input terminal 23. A first terminal of the eighth transistor 38 is electrically connected to the gate electrode of the second transistor 32 and the gate electrode of the fourth transistor 34, and a gate electrode of the eighth transistor 38 is electrically connected to the second input terminal 22. The first terminal of the ninth transistor 39 is electrically connected to the second terminal of the first transistor 31 and the second terminal of the second transistor 32, a second terminal of the ninth transistor 39 is electrically connected to a gate electrode of the third transistor 33 and a gate electrode of the tenth transistor 40, and a gate electrode of the ninth transistor 39 is electrically connected to the power supply line 52. A first terminal of the tenth transistor 40 is electrically connected to the first input terminal 21, a second terminal of the tenth transistor 40 is electrically connected to the second output terminal 27, and the gate electrode of the tenth transistor 40 is electrically connected to the second terminal of the ninth transistor 39. A first terminal of the eleventh transistor 41 is electrically connected to the power supply line 53, a second terminal of the eleventh transistor 41 is electrically connected to the second output terminal 27, and the gate electrode of the eleventh transistor 41 is electrically connected to the gate electrode of the second transistor 32 and the gate electrode of the fourth transistor 34. A first terminal of the twelfth transistor 42 is electrically connected to the power supply line 53, a second terminal of the twelfth transistor 42 is electrically connected to the second output terminal 27, and a gate electrode of the twelfth transistor 42 is electrically connected to the gate electrode of the seventh transistor 37. A first terminal of the thirteenth transistor 43 is electrically connected to the power supply line 53, a second terminal of the thirteenth transistor 43 is electrically connected to the first output terminal 26, and a gate electrode of the thirteenth transistor 43 is electrically connected to the gate electrode of the seventh transistor 37.

In FIG. 18A, a portion where the gate electrode of the third transistor 33, the gate electrode of the tenth transistor 40, and the second terminal of the ninth transistor 39 are connected is referred to as a node A. A portion where the gate electrode of the second transistor 32, the gate electrode of the fourth transistor 34, the second terminal of the fifth transistor 35, the second terminal of the sixth transistor 36, the first terminal of the eighth transistor 38, and the gate electrode of the eleventh transistor 41 are connected is referred to as a node B (see FIG. 18A).

Figure 18B:
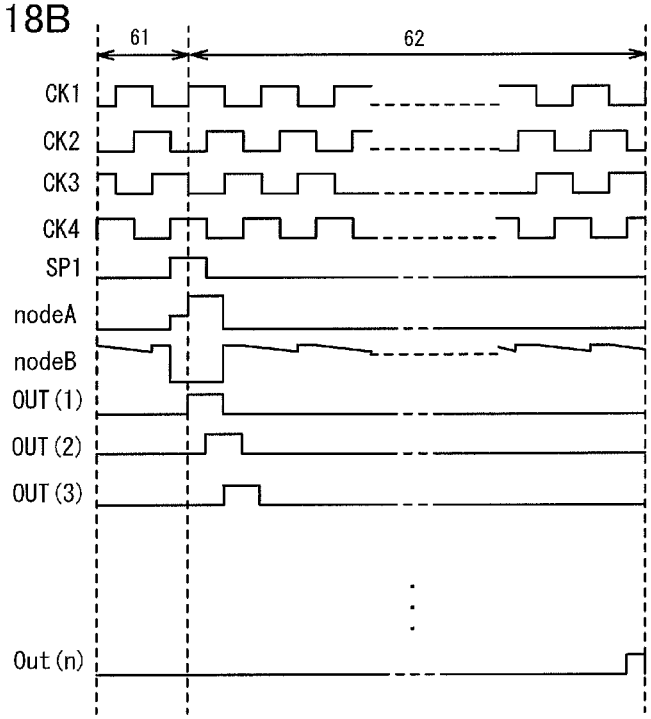

A timing chart of a shift register in which a plurality of pulse output circuits illustrated in FIG. 18A are provided is illustrated in FIG. 18B.

Note that the placement of the ninth transistor 39 in which the second power supply potential VCC is applied to the gate electrode as illustrated in FIG. 18A has the following advantages before and after bootstrap operation.

In the case where a potential of the node A is raised by bootstrap operation without the provision of the ninth transistor 39 in which the second power supply potential VCC is applied to the gate electrode, a potential of the source electrode which is the second terminal of the first transistor 31 rises to a value higher than the first power supply potential VDD. Then, the first terminal of the first transistor 31, that is, the terminal on the power supply line 51 side, comes to serve as a source electrode of the first transistor 31. Consequently, in the first transistor 31, a high bias voltage is applied and thus significant stress is applied between the gate electrode and the source electrode and between the gate electrode and the drain electrode, which might cause deterioration of the transistor. By providing of the ninth transistor 39 whose gate electrode is supplied with the second power supply potential VCC, the potential of the node A is raised by the bootstrap operation, but at the same time, an increase in the potential of the second terminal of the first transistor 31 can be prevented. In other words, by providing of the ninth transistor 39, a negative bias voltage applied between the gate electrode and the source electrode of the first transistor 31 can be reduced. Thus, the circuit configuration in this embodiment can reduce a negative bias voltage applied between the gate electrode and the source electrode of the first transistor 31, so that deterioration of the first transistor 31 due to stress can be suppressed.

The place of the ninth transistor 39 is not limited as long as the second terminal of the first transistor 31 and the gate electrode of the third transistor 33 are connected through the first terminal and the second terminal of the ninth transistor 39. Note that when the shift register including a plurality of pulse output circuits in this embodiment is included in a signal line driver circuit having a larger number of stages than a scan line driver circuit, the ninth transistor 39 may be omitted, which is advantageous in that the number of transistors is reduced.

Note that when oxide semiconductors are used for semiconductor layers for the first to the thirteenth transistors 31 to 43, the off-current of the thin film transistors can be reduced, the on-current and the field effect mobility can be increased, and the degree of deterioration can be reduced, whereby malfunction in a circuit can decrease. Further, the degree of deterioration of the transistor using oxide semiconductor caused by applying high potential to the gate electrode is small as compared to the transistor using amorphous silicon. Therefore, even when the first power supply potential VDD is supplied to a power supply line to which the second power supply potential VCC is supplied, a similar operation can be performed, and the number of power supply lines which are provided in a circuit can be reduced, so that the circuit can be miniaturized.

Note that a similar function is obtained even when the connection relation is changed so that a clock signal that is supplied to the gate electrode of the seventh transistor 37 from the third input terminal 23 and a clock signal that is supplied to the gate electrode of the eighth transistor 38 from the second input terminal 22 are supplied from the second input terminal 22 and the third input terminal 23, respectively. In this case, in the shift register illustrated in FIG. 18A, the state is changed from the state where both the seventh transistor 37 and the eighth transistor 38 are turned on, to the state where the seventh transistor 37 is turned off and the eighth transistor 38 is turned on, and then to the state where both the seventh transistor 37 and the eighth transistor 38 are turned off; thus, the fall in a potential of the node B due to fall in the potentials of the second input terminal 22 and the third input terminal 23 is caused twice by fall in the potential of the gate electrode of the seventh transistor 37 and fall in the potential of the gate electrode of the eighth transistor 38. On the contrary, in the shift register shown in FIG. 18A is driven so that the state where the seventh transistor 37 and the eighth transistor 38 are both on is changed through the state where the seventh transistor 37 is on and the eighth transistor 38 is off to the state where the seventh transistor 37 is off and the eighth transistor 38 is off, potential reduction at the node B, which is caused by fall in the of the second input terminal 22 and the third input terminal 23, is caused only once due to fall in the potential of the gate electrode of the eighth transistor 38. Therefore, the connection relation, that is, the clock signal is supplied from the third input terminal 23 to the gate electrode of the seventh transistor 37 and the clock signal is supplied from the second input terminal 22 to the gate electrode of the eighth transistor 38, is preferable. That is because the number of times of the change in the potential of the node B can be reduced, whereby the noise can be reduced.

In this manner, in a period during which the potentials of the first output terminal 26 and the second output terminal 27 are held at the L level, the H level signal is regularly supplied to the node B; therefore, malfunction of a pulse output circuit can be suppressed.

This embodiment can be implemented in combination with any of the above embodiments.

(Embodiment 7)

In this embodiment, manufacturing methods of semiconductor display devices according to one embodiment of the present invention are described with reference to FIGS. 19A to 19C, FIGS. 20A to 20C, FIGS. 21A and 21B, FIG. 22, FIG. 23, and FIG. 24.

Note that the term "successive film formation" in this specification means that during a series of a first film formation step by sputtering and a second film formation step by sputtering, an atmosphere in which a substrate to be processed is disposed is not contaminated by a contaminant atmosphere such as air, and is constantly controlled to be vacuum or an inert gas atmosphere (a nitrogen atmosphere or a rare gas atmosphere). By the successive film formation, film formation can be conducted to a substrate which has been cleaned, without re-attachment of moisture or the like.

Performing the process from the first film formation step to the second film formation step in the same chamber is within the scope of the successive formation in this specification.

In addition, the following is also within the scope of the successive formation in this specification: in the case of performing the process from the first film formation step to the second film formation step in plural chambers, the substrate is transferred after the first film formation step to another chamber without being exposed to air and subjected to the second film formation.

Note that between the first film formation step and the second film formation step, a substrate transfer step, an alignment step, a slow-cooling step, a step of heating or cooling the substrate to a temperature which is necessary for the second film formation step, or the like may be provided. Such a process is also within the scope of the successive formation in this specification.

A step in which liquid is used, such as a cleaning step, wet etching, or formation of a resist may be provided between the first deposition step and the second deposition step. This case is not within the scope of the successive deposition in this specification.

Figure 19A:
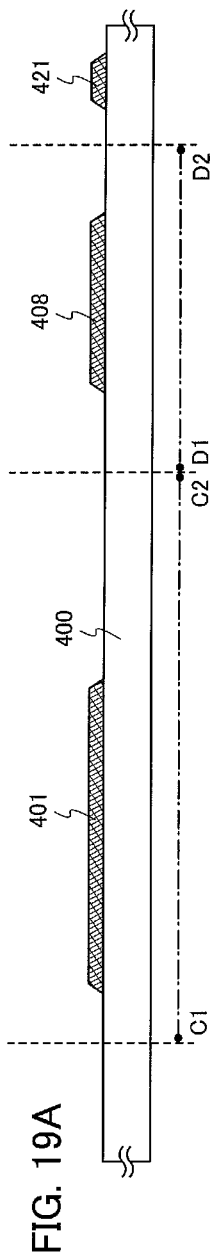
FIGS. 19A to 19C show a method for manufacturing a semiconductor device.

In FIG. 19A, a light-transmitting substrate 400 may be a glass substrate manufactured by a fusion method or a float method, or a metal substrate formed of a stainless alloy having an insulating film on the surface. A substrate formed from a flexible synthetic resin, such as plastic, generally tends to have a low allowable temperature limit, but can be used as the substrate 400 as long as the substrate can withstand processing temperatures in the later manufacturing process. Examples of a plastic substrate include polyester typified by polyethylene terephthalate (PET), polyethersulfone (PES), polyethylene naphthalate (PEN), polycarbonate (PC), polyetheretherketone (PEEK), polysulfone (PSF), polyetherimide (PEI), polyarylate (PAR), polybutylene terephthalate (PBT), polyimide, acrylonitrile-butadiene-styrene resin, polyvinyl chloride, polypropylene, polyvinyl acetate, acrylic resin, and the like.

In the case where a glass substrate is used and the temperature at which the heat treatment is to be performed later is high, a glass substrate whose strain point is more than or equal to 730° C. is preferably used. As a glass substrate, a glass material such as aluminosilicate glass, aluminoborosilicate glass, or barium borosilicate glass is used, for example. In general, a glass substrate containing more barium oxide (BaO) than diboron trioxide ($B_2O_3$) is more practical as heat-resistant glass. Therefore, a glass substrate containing a larger amount of BaO than $B_2O_3$ is preferably used.

Note that as the above glass substrate, a substrate formed of an insulator such as a ceramic substrate, a quartz substrate, or a sapphire substrate may be used. Alternatively, crystallized glass or the like may be used.

Next, a conductive film is formed entirely over a surface of the substrate 400, and then a first photolithography step is performed in such a manner that a resist mask is formed and unnecessary portions are removed by etching, so that wirings and an electrode (a gate wiring including a gate electrode 401, a capacitor wiring 408, and a first terminal 421) are formed. At this time, the etching is performed so that at least end portions of the gate electrode 401 are tapered.

A material for the conductive film can be a single layer or a stacked layer using one or more of a metal material such as molybdenum, titanium, chromium, tantalum, tungsten, neodymium, or scandium, or an alloy material which contains any of these metal materials as a main component, or nitride of these metals. Note that aluminum or copper can also be used as the above metal material as long as it can withstand a temperature of heat treatment performed in a later step.

For example, as a conductive film having a two-layer stack structure, the following structures are preferable: a two-layer structure of an aluminum layer and a molybdenum layer stacked thereover, a two-layer structure of a copper layer and a molybdenum layer stacked thereover, a two-layer structure of a copper layer and a titanium nitride layer or a tantalum nitride layer stacked thereover, and a two-layer structure of a titanium nitride layer and a molybdenum layer. As a three-layer structure, the following structure is preferable: a layered structure containing aluminum, an alloy of aluminum and silicon, an alloy of aluminum and titanium, or an alloy of aluminum and neodymium in a middle layer and any of tungsten, tungsten nitride, titanium nitride, and titanium in a top layer and a bottom layer.

A light-transmitting oxide conductive layer can be used for part of the electrode layer and the wiring to increase the aperture ratio. For example, indium oxide, an alloy of indium oxide and tin oxide, an alloy of indium oxide and zinc oxide, zinc oxide, zinc aluminum oxide, zinc aluminum oxynitride, zinc gallium oxide, or the like can be used.

The thicknesses of the gate electrode 401, the capacitor wiring 408, and the first terminal 421 are each 10 nm to 400 nm, preferably 100 nm to 200 nm. In this embodiment, after a conductive film with a thickness of 100 nm for the gate electrode is formed by a sputtering method using a tungsten target, the conductive film is processed (patterned) by etching to have a desired shape, so that the gate electrode 401, the capacitor wiring 408, and the first terminal 421 are formed.

An insulating film serving as a base film may be provided between the substrate 400 and the gate electrode 401, the capacitor wiring 408, and the first terminal 421. The base film has a function of preventing diffusion of an impurity element from the substrate 400, and can be formed with a single layer or stacked layer using one or more films selected from a silicon nitride film, a silicon oxide film, a silicon nitride oxide film, and a silicon oxynitride film.

Figure 19B:
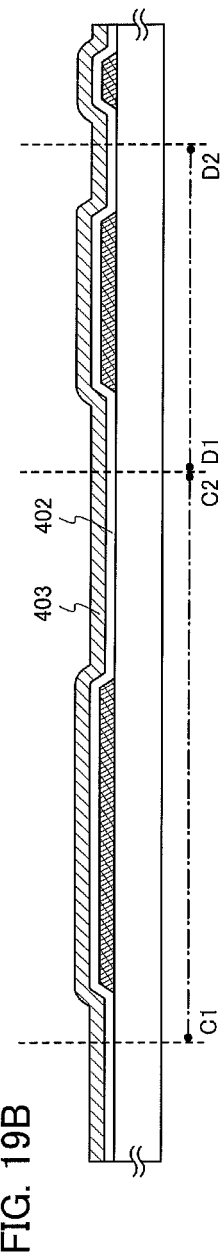

Next, a gate insulating film 402 is formed entirely over surfaces of the gate electrode 401, the capacitor wiring 408, the first terminal 421 as illustrated in FIG. 19B. The gate insulating film 402 can be formed to have a single layer of a silicon oxide film, a silicon nitride film, a silicon oxynitride film, a silicon nitride oxide film, an aluminum oxide film, or a tantalum oxide film or a stacked layer thereof by a plasma CVD method, a sputtering method, or the like. For example, a silicon oxynitride film may be formed using a deposition gas including silane (for example, monosilane), oxygen, and nitrogen by a plasma CVD method.

The film thickness of the gate insulating film 402 is desirably more than or equal to 50 nm and less than or equal to 250 nm. In this embodiment, a silicon oxynitride film with a thickness of 100 nm formed by a plasma CVD method is used as the gate insulating film 402.

Next, an oxide semiconductor film 403 is formed over the gate insulating film 402. The oxide semiconductor film 403 is formed by a sputtering method with use of an oxide semiconductor as a target. Moreover, the oxide semiconductor film 403 can be formed by a sputtering method under a rare gas (for example, argon) atmosphere, an oxygen atmosphere, or an atmosphere including a rare gas (for example, argon) and oxygen.

It is preferable that before the oxide semiconductor film 403 is formed by a sputtering method, dust on a surface of the gate insulating film 402 be removed by reverse sputtering by introducing an argon gas and generating plasma. The reverse sputtering refers to a method in which, without application of a voltage to a target side, an RF power source is used for application of a voltage to a substrate side in an argon atmosphere to generate plasma in the vicinity of the substrate to modify a surface. Note that instead of an argon atmosphere, a nitrogen atmosphere, a helium atmosphere, or the like may be used. Alternatively, an argon atmosphere to which oxygen, nitrous oxide, or the like is added may be used. Alternatively, an argon atmosphere to which chlorine, carbon tetrafluoride, or the like is added may be used.

The oxide semiconductor film 403 for formation of a channel formation region may be formed using the above-described oxide material having semiconductor characteristics.

The thickness of the oxide semiconductor film 403 is 5 nm to 300 nm, preferably 10 nm to 100 nm. In this embodiment, film deposition is performed using an oxide semiconductor target containing In, Ga, and Zn ($In_2O_3:Ga_2O_3:ZnO=1:1:1$ or $In_2O_3:Ga_2O_3:ZnO=1:1:2$ [mol ratio]) under the following condition: the distance between a substrate and a target is 100 mm, the pressure is 0.6 Pa, the direct-current (DC) power supply is 0.5 kW, and the atmosphere is oxygen (the flow rate of oxygen is 100%). Note that a pulse direct current (DC) power supply is preferable because dust due to film deposition can be reduced and the film thickness can be uniform. In this embodiment, a 50 nm-thick In—Ga—Zn—O-based non-single-crystal film is formed as the oxide semiconductor film.

After the sputtering, the oxide semiconductor film is formed without exposure to the air, whereby adhesion of dust and moisture to an interface between the gate insulating film 402 and the oxide semiconductor film 403 can be prevented. Further, a pulsed direct current (DC) power supply is preferable because dust can be reduced and a thickness distribution is uniform.

It is preferable that the relative density of the oxide semiconductor target is greater than or equal to 80%, more preferably greater than or equal to 95%, further preferably, greater than or equal to 99.9%. The impurity concentration in the oxide semiconductor film which is formed using the target having high relative density can be reduced, and thus a thin film transistor having high electric characteristics or high reliability can be obtained.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

In addition, there are a sputtering apparatus provided with a magnet system inside the chamber and used for a magnetron sputtering, and a sputtering apparatus used for an ECR sputtering in which plasma generated with the use of microwaves is used without using glow discharge.

Furthermore, as a deposition method by sputtering, there are also a reactive sputtering method in which a target substance and a sputtering gas component are chemically reacted with each other during deposition to form a thin compound film thereof, and a bias sputtering in which a voltage is also applied to a substrate during deposition.

In addition, the substrate may be heated at a temperature of more than or equal to 400° C. and less than or equal to 700° C. by light or a heater during the film formation with a sputtering method. The damage due to sputtering is repaired at the same time as the film formation by heating during the film formation.

Preheat treatment is preferably performed so as to remove moisture or hydrogen remaining on an inner wall of the sputtering apparatus, on a surface of the target, or in a target material, before the oxide semiconductor film is formed. As the preheat treatment, a method in which the inside of the film formation chamber is heated to 200° C. to 600° C. under reduced pressure, a method in which introduction and evacuation of nitrogen or an inert gas are repeated while the inside of the film formation chamber is heated, and the like can be given. After the preheat treatment, the substrate or the sputtering apparatus is cooled, and then the oxide semiconductor film is formed without exposure to air. In this case, not water but oil or the like is preferably used as a coolant for the target. Although a certain level of effect can be obtained when introduction and evacuation of nitrogen are repeated without heating, it is more preferable to perform the treatment with the inside of the film formation chamber heated.

It is preferable to remove moisture or the like remaining in the sputtering apparatus with the use of a cryopump before, during, or after the oxide semiconductor film is formed.

Figure 19C:
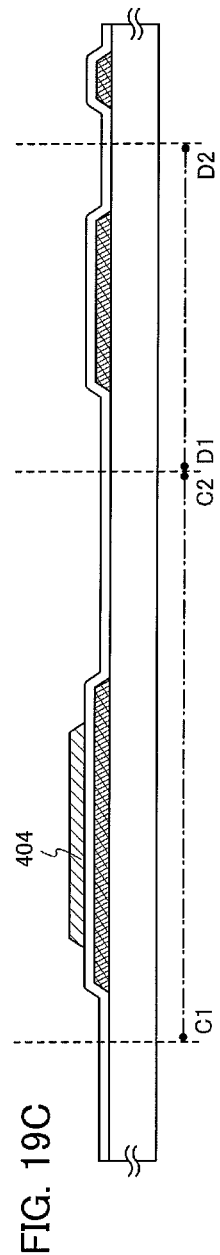

Next, as illustrated in FIG. 19C, a second photolithography step is performed in such a manner that a resist mask is formed and the oxide semiconductor film 403 is etched. For example, unnecessary portions are removed by wet etching using a mixed solution of phosphoric acid, acetic acid, and nitric acid, so that an island-shaped oxide semiconductor film 404 can be formed so as to overlap with the gate electrode 401. In etching of the oxide semiconductor film 403, organic acid such as citric acid or oxalic acid can be used for etchant. In this embodiment, the unnecessary portions are removed by wet etching using ITO07N (product of Kanto Chemical Co., Inc.), so that the island-shaped oxide semiconductor film 404 is formed. Note that etching here is not limited to wet etching and dry etching may be used.

As the etching gas for dry etching, a gas containing chlorine (chlorine-based gas such as chlorine ($Cl_2$), boron chloride ($BCl_3$), silicon chloride ($SiCl_4$), or carbon tetrachloride ($CCl_4$)) is preferably used.

Alternatively, a gas containing fluorine (fluorine-based gas such as carbon tetrafluoride ($CF_4$), sulfur fluoride ($SF_6$), nitrogen fluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel plate RIE (reactive ion etching) method or an ICP (inductively coupled plasma) etching method can be used. In order to etch the films into desired shapes, the etching condition (the amount of electric power applied to a coil-shaped electrode, the amount of electric power applied to an electrode on a substrate side, the temperature of the electrode on the substrate side, or the like) is adjusted as appropriate.

The etchant after the wet etching is removed together with the etched materials by cleaning. The waste liquid including the etchant and the material etched off may be purified and the material may be reused. When a material such as indium contained in the oxide semiconductor film is collected from the waste liquid after the etching and reused, the resources can be efficiently used and the cost can be reduced.

In order to obtain a desired shape by etching, the etching conditions (such as an etchant, etching time, and temperature) are adjusted as appropriate depending on the material.

Figure 20A:
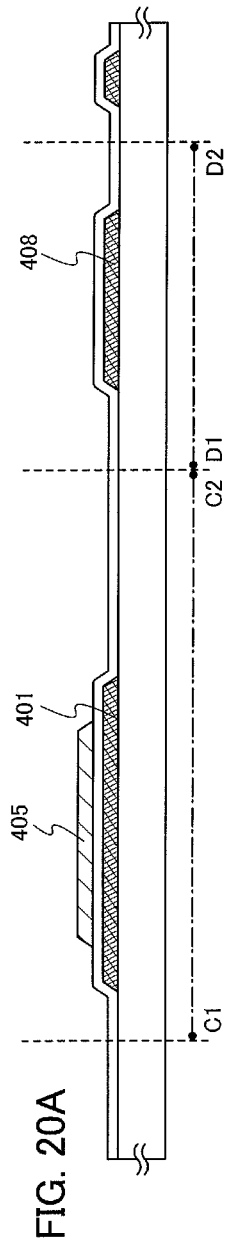
FIGS. 20A to 20C show the method for manufacturing a semiconductor device.

Next, as illustrated in FIG. 20A, heat treatment may be performed on the oxide semiconductor film 404 under a reduced-pressure atmosphere, an atmosphere of an inert gas such as nitrogen and a rare gas, an oxygen gas atmosphere, or an ultra-dry air atmosphere (the moisture amount is 20 ppm (−55° C. by conversion into a dew point) or less, preferably 1 ppm or less, more preferably 10 ppb or less when measured by a dew point meter in a CRDS (cavity ring down laser spectroscopy) method). With the heat treatment on the oxide semiconductor film 404, the oxide semiconductor film 405 is formed. Specifically, under an inert gas atmosphere (e.g., nitrogen, helium, neon, or argon), rapid thermal annealing (RTA) treatment can be performed at a temperature of more than or equal to 500° C. and less than or equal to 750° C. (or a temperature lower than or equal to the strain point of the glass substrate) for approximately more than or equal to 1 minute and less than or equal to 10 minutes, preferably, at 650° C. for approximately more than or equal to 3 minutes and less than or equal to 6 minutes. With an RTA method, dehydration or dehydrogenation can be performed in a short time; therefore, treatment can be performed even at a temperature higher than the strain point of the glass substrate. Note that the timing of the above-described heat treatment is not limited to this timing after formation of the oxide semiconductor film 404, and the oxide semiconductor film 403 before formation of the oxide semiconductor film 404 may be subjected to the heat treatment. The heat treatment may also be performed plural times after formation of the oxide semiconductor film 404.

Further, a heating method using an electric furnace, a rapid heating method such as a gas rapid thermal annealing (GRTA) method using a heated gas or a lamp rapid thermal annealing (LRTA) method using lamp light, or the like can be used for the heat treatment. For example, in the case of performing heat treatment using an electric furnace, the temperature rise characteristics is preferably set at higher than or equal to 0.1° C./min and lower than or equal to 20° C./min and the temperature drop characteristics is preferably set at higher than or equal to 0.1° C./min and lower than or equal to 15° C./min.

Note that in heat treatment, it is preferable that moisture, hydrogen, and the like be not contained in nitrogen or a rare gas such as helium, neon, or argon. It is preferable that the purity of nitrogen or the rare gas such as helium, neon, or argon which is introduced into a heat treatment apparatus be set to be 6N (99.9999%) or higher, preferably 7N (99.99999%) or higher (that is, the impurity concentration is 1 ppm or lower, preferably 0.1 ppm or lower).

After the heat treatment under an inert gas atmosphere, the island-shaped oxide semiconductor film 405 may be crystallized partly or entirely.

Cross-sectional views taken along dashed lines C1-C2 and D1-D2 in FIG. 20A correspond to cross-sectional views taken along dashed lines C1-C2 and D1-D2 in a plan view illustrated in FIG. 22, respectively.

Figure 20B:
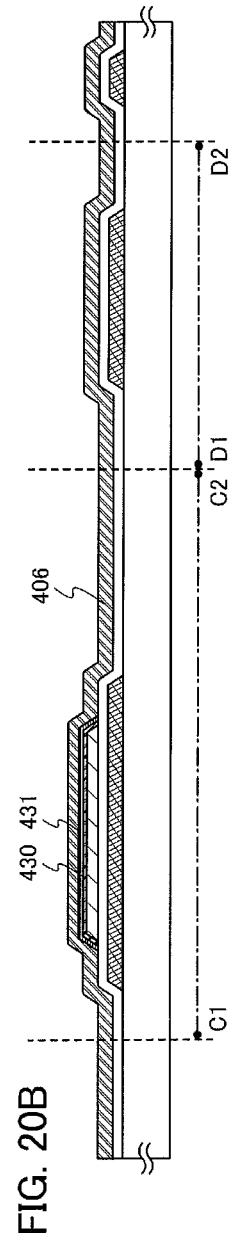

Next, as illustrated in FIG. 20B, a conductive film 406 is formed using a metal material over the oxide semiconductor film 405 by a sputtering method or a vacuum evaporation method. As a material of a conductive film 406, for example, an element selected from titanium, tungsten, and molybdenum, an alloy containing one or more of the above elements, or the like can be used. In a semiconductor device of one embodiment of the present invention, in the source electrode 407a and the drain electrode 407b, at least a portion which is the closest to the island-shaped oxide semiconductor film 405 may be formed using an element selected from titanium, tungsten, and molybdenum, an alloy containing one or more of the above elements, or the like. Therefore, in the case where the source electrode 407a and the drain electrode 407b each having a structure in which a plurality of metal films are stacked, a metal film that is in contact with the oxide semiconductor film 405 may be formed using titanium, tungsten, or molybdenum, and the other metal films can be formed using any of the following examples: an element selected from aluminum, chromium, tantalum, titanium, manganese, magnesium, molybdenum, tungsten, zirconium, beryllium, and yttrium; an alloy containing one or more of the above elements as a component; a nitride containing the above element as a component; or the like. For example, by using a conductive film 406 having a stacked structure of a titanium film, an aluminum alloy film containing neodymium, and a titanium film, and by using the titanium film in the portion which is the closest to the island-shaped oxide semiconductor film 405, the source electrode 407a and the drain electrode 407b can have a low resistance and high heat resistance in the aluminum alloy film containing neodymium.

Note that in the case where heat treatment is performed after the formation of the conductive film 406 for the source electrode and the drain electrode, the conductive film 406 preferably has heat resistance enough to withstand the heat treatment. In the case of performing heat treatment after the formation of the conductive film 406, the conductive film 406 is formed in combination with the heat-resistant conductive material because aluminum alone has problems of low heat resistance, being easily corroded, and the like. As the heat-resistant conductive material which is combined with aluminum, the following material is preferably used: an element selected from titanium, tantalum, tungsten, molybdenum, chromium, neodymium, and scandium; an alloy containing one or more of these elements as a component; a nitride containing any of these elements as a component; or the like.

The thickness of the conductive film 406 for the source electrode and the drain electrode is 10 nm to 400 nm, preferably 100 nm to 200 nm. In this embodiment, the conductive film 406 for a source electrode and a drain electrode is formed by a sputtering method using a titanium target.

By forming the conductive film 406 having the above structure, oxygen in the region of the oxide semiconductor film 405 which is the closest to the conductive film 406 is taken out, so that the composite layers 430 where the concentration of a metal contained in the oxide semiconductor film 405 is higher than that in other regions (metal-rich layers) are formed in the oxide semiconductor film 405. The oxygen that is taken out reacts with the metal in the conductive film 406, so that the metal oxide films 431 are formed between the conductive film 406 and the metal-rich composite layers 430.

Figure 20C:
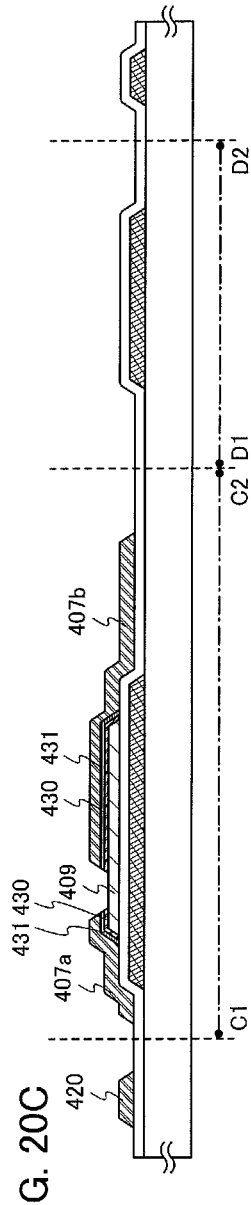

Next, as illustrated in FIG. 20C, a third photolithography step is performed in such a manner that a resist mask is formed and unnecessary portions of the conductive film 406 are removed by wet etching or dry etching, so that a source electrode 407a, a drain electrode 407b, and a second terminal 420 are formed. For example, in the case where the conductive film 406 is formed using titanium, wet etching can be performed by using a hydrogen peroxide solution or heated hydrochloric acid as etchant. Note that since oxygen is further taken out from the oxide semiconductor film 412 by the heat treatment, it is possible to increase the thickness of the composite layers 430 and the metal oxide films 431.

In the above-described etching step, since the composite layer 430 is etched in an exposed region of the oxide semiconductor film 405, an island-shaped oxide semiconductor film 409 having a thin region between the source electrode 407a and the drain electrode 407b can be formed in some cases.

In addition, in the above-described etching, the metal oxide film 431 is etched together with the conductive film 406. Thus, there are the etched metal oxide film 431 between the composite layer 430 of the oxide semiconductor film 409 and the source electrode 407a, and the etched metal oxide film 431 between the composite layer 430 of the oxide semiconductor film 409 and the drain electrode 407b. The composite layer 430 on the source electrode 407a side and the composite layer 430 on the drain electrode 407b side are separated from each other. In addition, the metal oxide film 431 on the source electrode 407a side and the metal oxide film 431 on the drain electrode 407b side are separated from each other.

For example, in the case where an In—Ga—Zn—O-based oxide semiconductor is used for the oxide semiconductor film 405, the composite layers 430 where the concentration of indium is higher than that in other regions (In-rich layers) exist in regions of the oxide semiconductor film 405 which are the closest to the source electrode 407a and the drain electrode 407b, so that resistance of the In-rich composite layers 430 in the oxide semiconductor film 405 becomes lower. In the case where titanium is used for the source electrode 407a and the drain electrode 407b, the metal oxide films 431 formed between the source electrode 407a and the oxide semiconductor film 405, and between the drain electrode 407b and the oxide semiconductor film 405 contain titanium oxide (TiOx) and have n-type conductivity. Therefore, with the above structure, contact resistance between the source electrode 407a and the oxide semiconductor film 405, and between the drain electrode 407b and the oxide semiconductor film 405 is reduced, and the amount of on-current and field effect mobility of a TFT can be increased.

In the third photolithography step, the second terminal 420 which is formed using the same material as the source electrode 407a and the drain electrode 407b is left in the terminal portion. Note that the second terminal 420 is electrically connected to a source wiring (a source wiring including the source electrode 407a and the drain electrode 407b).

Further, by using a resist mask which is formed using a multi-tone mask and has regions with plural thicknesses (for example, two different thicknesses), the number of resist masks can be reduced, resulting in simplified process and lower costs.

Figure 23:
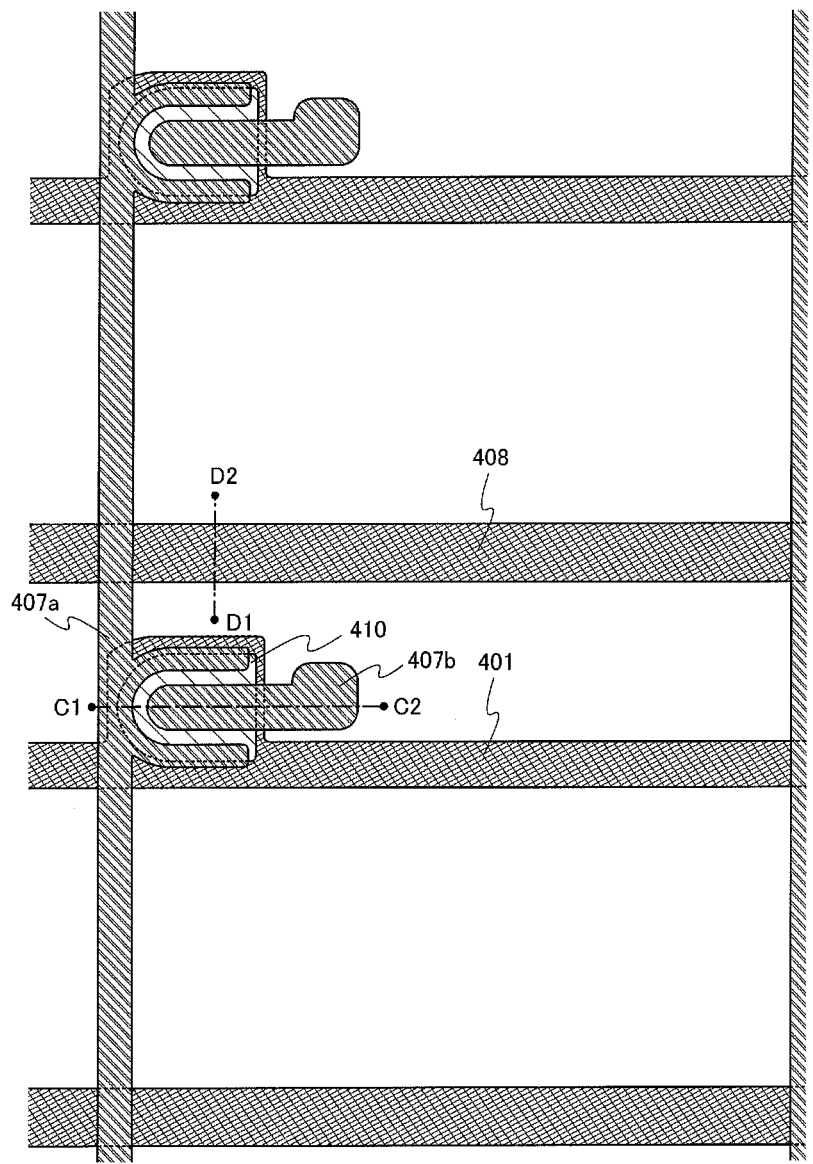
FIG. 23 shows the method for manufacturing a semiconductor device.
Figure 24:
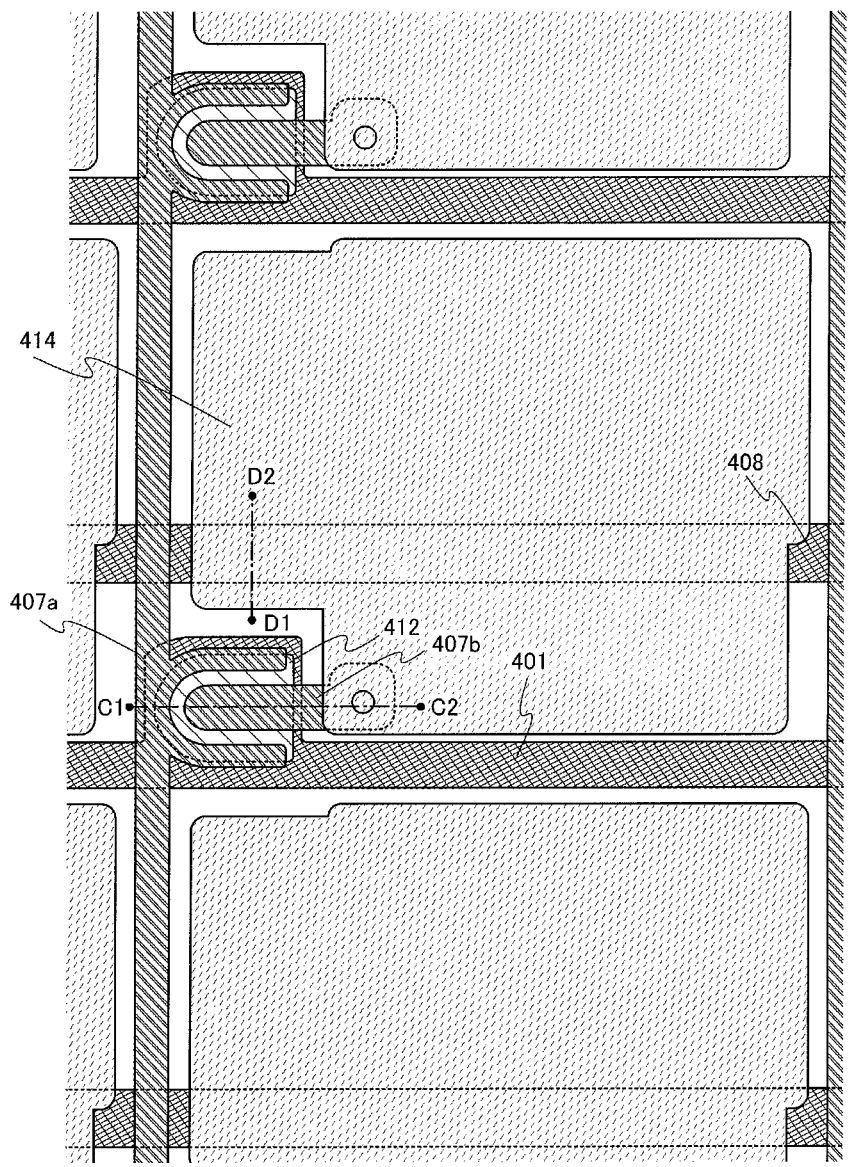
FIG. 24 shows the method for manufacturing a semiconductor device.

Cross-sectional views taken along dashed lines C1-C2 and D1-D2 in FIG. 20C correspond to cross-sectional views taken along dashed lines C1-C2 and D1-D2 in a plan view illustrated in FIG. 23, respectively.

Next, as illustrated in FIG. 21A, an oxide insulating film 411 which covers the gate insulating film 402, the oxide semiconductor film 409, the source electrode 407a, and the drain electrode 407b is formed. In this embodiment, a silicon oxide film with a thickness of 300 nm is formed as the oxide insulating film 411. The substrate temperature in film formation may be higher than or equal to room temperature and lower than or equal to 300° C. and is 100° C. in this embodiment. Formation of the silicon oxide film with a sputtering method can be performed under a rare gas (for example, argon) atmosphere, an oxygen atmosphere, or an atmosphere including a rare gas (for example, argon) and oxygen. Further, a silicon oxide target or a silicon target may be used as a target. For example, with use of a silicon target, a silicon oxide film can be formed by a sputtering method under an atmosphere of oxygen and nitrogen.

By providing the oxide insulating film 411 in contact with the exposed region of the oxide semiconductor film 409 provided between the source electrode 407a and the drain electrode 407b, the resistance of the region of the oxide semiconductor film 409 which is in contact with the oxide insulating film 411 becomes higher (the carrier concentration is decreased, preferably to a value lower than $1\times10^{18}/cm^3$), resulting in formation of an oxide semiconductor film 412 having a high-resistance channel formation region.

In this embodiment, the oxide insulating film 411 with a thickness of 300 nm is formed by a pulsed DC sputtering method using a columnar polycrystalline, boron-doped silicon target which has a purity of 6N (the resistivity is 0.01 Ωcm), in which the distance between the substrate and the target (T-S distance) is 89 mm, the pressure is 0.4 Pa, the direct-current (DC) power source is 6 kW, and the atmosphere is oxygen (the oxygen flow rate is 100%).

Next, after the oxide insulating film 411 is formed, second heat treatment may be performed. The second heat treatment is performed under a reduced-pressure atmosphere, an atmosphere of an inert gas such as nitrogen and a rare gas, an oxygen gas atmosphere, or an ultra-dry air atmosphere (the moisture amount is 20 ppm (−55° C. by conversion into a dew point) or less, preferably 1 ppm or less, more preferably 10 ppb or less when measured by a dew point meter in a CRDS (cavity ring down laser spectroscopy) method, at a temperature of more than or equal to 200° C. and less than or equal to 400° C., for example, more than or equal to 250° C. and less than or equal to 350° C.). For example, the second heat treatment is performed in a nitrogen atmosphere at 250° C. for one hour. Alternatively, RTA treatment may be performed at high temperature for a short time as in the previous heat treatment. By the heat treatment, the oxide semiconductor film 412 is heated while being in contact with the oxide insulating film 411. In addition, the resistance of the oxide semiconductor film 412 is increased. Accordingly, electric characteristics of the transistor can be improved and variation in the electric characteristics thereof can be reduced. There is no particular limitation on when to perform this heat treatment as long as it is performed after the formation of the oxide insulating film 411. When this heat treatment also serves as heat treatment in another step, for example, heat treatment in formation of a resin film or heat treatment for reducing resistance of a transparent conductive film, the number of steps can be prevented from increasing.

Through the above steps, a thin film transistor 413 can be manufactured.

Next, a fourth photolithography step is performed in such a manner that a resist mask is formed and the oxide insulating film 411 and the gate insulating film 402 are etched, so that a contact hole is formed to expose parts of the drain electrode 407b, the first terminal 421, and the second terminal 420. Next, the resist mask is removed, and then a transparent conductive film is formed. The transparent conductive film is formed of indium oxide ($In_2O_3$), indium oxide-tin oxide alloy ($In_2O_3$—$SnO_2$, abbreviated to ITO), or the like by a sputtering method, a vacuum evaporation method, or the like. Such a material is etched with a hydrochloric acid-based solution. However, since a residue is easily generated particularly in etching ITO, indium oxide-zinc oxide alloy ($In_2O_3$—ZnO) may be used to improve etching processability. Moreover, in the case where heat treatment for reducing resistance of the transparent conductive film, the heat treatment can serve as heat treatment for increasing resistance of the oxide semiconductor film 412, which results in improvement of electric characteristics of the transistor and reduction in variation in the electric characteristics thereof.

Next, a fifth photolithography step is performed in such a manner that a resist mask is formed and unnecessary portions are removed by etching, so that a pixel electrode 414 which is connected to the drain electrode 407b, a transparent conductive film 415 which is connected to the first terminal 421, and a transparent conductive film 416 which is connected to the second terminal 420 are formed.

The transparent conductive films 415 and 416 serve as electrodes or wirings connected to an FPC. The transparent conductive film 415 formed over the first terminal 421 is a connection terminal electrode which functions as an input terminal of the gate wiring. The transparent conductive film 416 formed over the second terminal 420 is a connection terminal electrode which functions as an input terminal of the source wiring.

In the fifth photolithography step, a storage capacitor is formed with the capacitor wiring 408 and the pixel electrode 414, in which the gate insulating film 402 and the oxide insulating film 411 are used as dielectrics.

A cross-sectional view after the resist mask is removed is illustrated in FIG. 21B. Cross-sectional views taken along dashed lines C1-C2 and D1-D2 in FIG. 21B correspond to cross-sectional views taken along dashed lines C1-C2 and D1-D2 in a plan view illustrated in FIG. 24, respectively.

Through these six photolithography steps, the storage capacitor and the thin film transistor 413 which is a bottom-gate staggered thin film transistor can be completed using the six photomasks. By disposing the thin film transistor and the storage capacitor in each pixel of a pixel portion in which pixels are arranged in a matrix form, one of substrates for manufacturing an active matrix display device can be obtained. In this specification, such a substrate is referred to as an active matrix substrate for convenience.

In the case of manufacturing an active matrix liquid crystal display device, an active matrix substrate and a counter substrate provided with a counter electrode are bonded to each other with a liquid crystal layer interposed therebetween.

Alternatively, a storage capacitor may be formed with a pixel electrode which overlaps with a gate wiring of an adjacent pixel, with an oxide insulating film and a gate insulating film interposed therebetween, without provision of the capacitor wiring.

In an active matrix liquid crystal display device, pixel electrodes arranged in a matrix form are driven to form a display pattern on a screen. Specifically, a voltage is applied between a selected pixel electrode and a counter electrode corresponding to the pixel electrode, so that a liquid crystal layer provided between the pixel electrode and the counter electrode is optically modulated and this optical modulation is recognized as a display pattern by an observer.

In manufacturing a light-emitting display device, a partition wall including an organic resin film is provided between organic light-emitting elements in some cases. In that case, heat treatment performed on the organic resin film can also serve as the heat treatment which increases the resistance of the oxide semiconductor film 412 so that improvement and less variation in electric characteristics of the transistor are achieved.

The use of an oxide semiconductor for a thin film transistor leads to reduction in manufacturing cost. In particular, by the heat treatment, impurities such as moisture, hydrogen, or OH are reduced and the purity of the oxide semiconductor film is increased. As a result, a semiconductor display device including a highly reliable thin film transistor having favorable electric characteristics can be manufactured.

Since the semiconductor film in the channel formation region is a region whose resistance is increased, electric characteristics of the thin film transistor are stabilized, and increase in off-current or the like can be prevented. Accordingly, a semiconductor display device including the highly reliable thin film transistor having favorable electric characteristics can be provided.

This embodiment can be implemented in combination with any of the above embodiments.

(Embodiment 8)

In the liquid crystal display device according to one embodiment of the present invention, a highly reliable thin film transistor with high mobility and on-current is used; therefore, the liquid crystal display device according to one embodiment of the present invention has high contrast and high visibility. In this embodiment, a structure of the liquid crystal display device according to an embodiment of the present invention is described.

Figure 25:
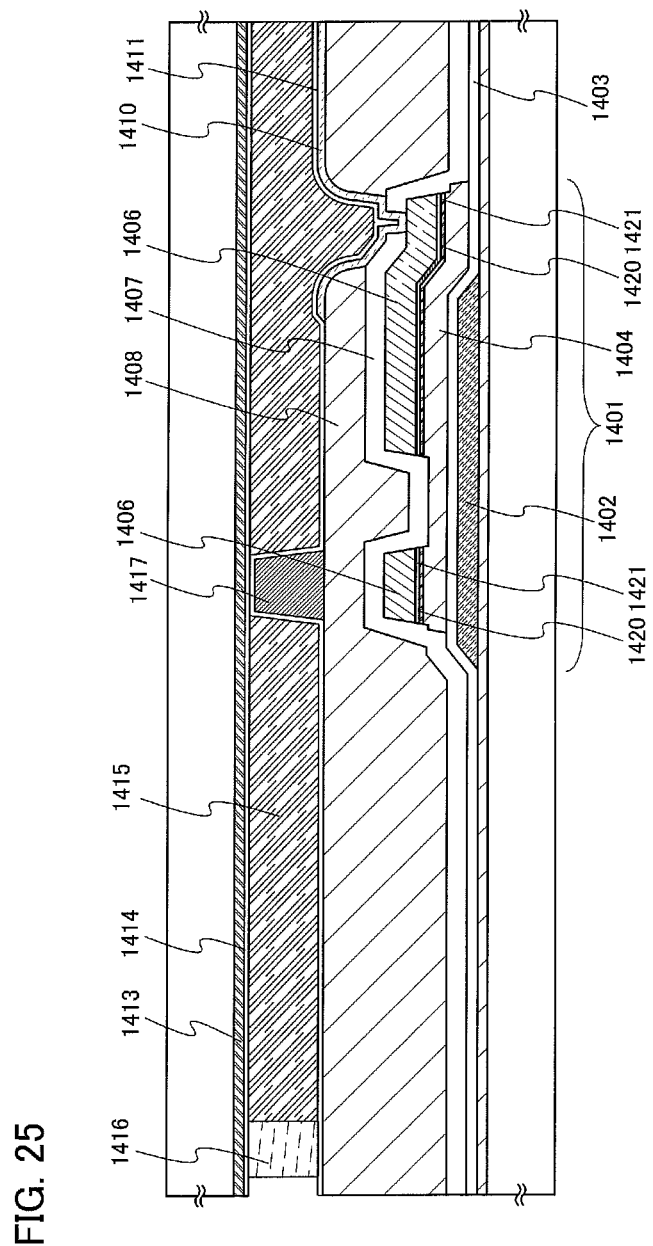
FIG. 25 illustrates a cross-sectional view of a liquid crystal display device.

FIG. 25 illustrates as an example a cross-sectional view of a pixel in a liquid crystal display device of one embodiment of the present invention. The thin film transistor 1401 illustrated in FIG. 25 includes a gate electrode 1402 formed over an insulating surface, a gate insulating film 1403 over the gate electrode 1402, an oxide semiconductor film 1404 which overlaps with the gate electrode 1402 over the gate insulating film 1403 and which includes composite layers 1420 where the concentration of one or a plurality of metals contained in the oxide semiconductor is higher than that in other regions, a pair of metal oxide films 1421 formed over the oxide semiconductor film 1404 and in contact with the composite layers 1420, and a pair of conductive films 1406 which function as a source electrode and a drain electrode and which are in contact with the metal oxide films 1421. Further, the thin film transistor 1401 may include as its component an oxide insulating film 1407 formed over the oxide semiconductor film 1404. The oxide insulating film 1407 is formed so as to cover the gate electrode 1402, the gate insulating film 1403, the oxide semiconductor film 1404, and the pair of conductive films 1406. The metal oxide films 1421 are formed by oxidation of a metal contained in the pair of conductive films 1406.

An insulating film 1408 is formed over the oxide insulating film 1407. An opening is provided in part of the oxide insulating film 1407 and the insulating film 1408, and a pixel electrode 1410 is formed so as to be in contact with one of the conductive films 1406 in the opening.

Further, a spacer 1417 for controlling a cell gap of a liquid crystal element is formed over the insulating film 1408. An insulating film is etched to have a desired shape, so that the spacer 1417 can be formed. A cell gap may also be controlled by dispersing a filler over the insulating film 1408.

An alignment film 1411 is formed over the pixel electrode 1410. The alignment film 1411 can be formed by subjecting an insulating film to rubbing treatment. Further, a counter electrode 1413 is provided in a position opposed to the pixel electrode 1410, and an alignment film 1414 is formed on the side of the counter electrode 1413 which is close to the pixel electrode 1410. Furthermore, a liquid crystal 1415 is provided in a region which is surrounded by a sealant 1416 between the pixel electrode 1410 and the counter electrode 1413. Note that a filler may be mixed in the sealant 1416.

The pixel electrode 1410 and the counter electrode 1413 can be formed using a transparent conductive material such as indium tin oxide containing silicon oxide (ITSO), indium tin oxide (ITO), zinc oxide (ZnO), indium zinc oxide (IZO), or gallium-doped zinc oxide (GZO), for example. Note that this embodiment shows an example of manufacturing a transmissive type liquid crystal element by using a light-transmitting conductive film for the pixel electrode 1410 and the counter electrode 1413. The liquid crystal display device according to an embodiment of the present invention may be a semi-transmissive type liquid crystal display device or a reflective type liquid crystal display device.

The liquid crystal display device illustrated in FIG. 25 may be provided with a color filter, a shielding film for preventing disclination (a black matrix), or the like.

Although a liquid crystal display device of a TN (twisted nematic) mode is described in this embodiment, the thin film transistor of one embodiment of the present invention can be used for other liquid crystal display devices of a VA (vertical alignment) mode, an OCB (optically compensated birefringence) mode, an IPS (in-plane-switching) mode, and the like.

Alternatively, liquid crystal exhibiting a blue phase for which an alignment film is unnecessary may be used. A blue phase is one of liquid crystal phases, which is generated right before a cholesteric phase changes into an isotropic phase while temperature of cholesteric liquid crystal is increased. Since the blue phase is generated within an only narrow range of temperature, liquid crystal composition in which a chiral agent at 5 wt % or more is mixed is used for the liquid crystal 1415 in order to improve the temperature range. The liquid crystal composition which includes liquid crystal exhibiting a blue phase and a chiral agent have such characteristics that the response time is more than or equal to 10 µsec. and less than or equal to 100 µsec., which is short, the alignment process is unnecessary because the liquid crystal composition has optical isotropy, and viewing angle dependency is small.

Figure 27:
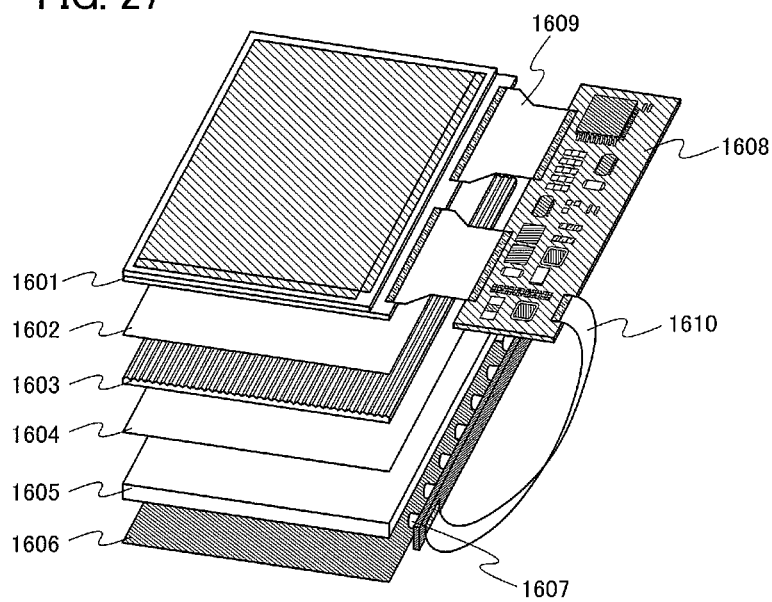
FIG. 27 illustrates a structure of a liquid crystal display device module.

FIG. 27 illustrates an example of a perspective view showing a structure of a liquid crystal display device of the present invention. The liquid crystal display device shown in FIG. 27 is provided with a liquid crystal panel 1601 in which a liquid crystal element is formed between a pair of substrates; a first diffusing plate 1602; a prism sheet 1603; a second diffusing plate 1604; a light guide plate 1605; a reflection plate 1606; a light source 1607; and a circuit substrate 1608.

The liquid crystal panel 1601, the first diffusing plate 1602, the prism sheet 1603, the second diffusing plate 1604, the light guide plate 1605, and the reflection plate 1606 are stacked in this order. The light source 1607 is provided at an end portion of the light guide plate 1605. The liquid crystal panel 1601 is uniformly irradiated with light from the light source 1607 which is diffused inside the light guide plate 1605, due to the first diffusing plate 1602, the prism sheet 1603, and the second diffusing plate 1604.

Although the first diffusing plate 1602 and the second diffusing plate 1604 are used in this embodiment, the number of diffusing plates is not limited thereto. The number of diffusing plates may be one, or may be three or more. It is acceptable as long as the diffusing plate is provided between the light guide plate 1605 and the liquid crystal panel 1601. Therefore, a diffusing plate may be provided only on the side closer to the liquid crystal panel 1601 than the prism sheet 1603, or may be provided only on the side closer to the light guide plate 1605 than the prism sheet 1603.

Further, the cross section of the prism sheet 1603 is not limited to a sawtooth-shape illustrated in FIG. 27. The prism sheet 1603 may have a shape with which light from the light guide plate 1605 can be concentrated on the liquid crystal panel 1601 side.

The circuit substrate 1608 is provided with a circuit which generates various kinds of signals input to the liquid crystal panel 1601, a circuit which processes the signals, or the like. In FIG. 27, the circuit substrate 1608 and the liquid crystal panel 1601 are connected to each other through an FPC (flexible printed circuit) 1609. Note that the above-described circuits may be connected to the liquid crystal panel 1601 by a COG (chip on glass) method, or part of the circuits may be connected to the liquid crystal panel 1601 by a COF (chip on film) method.

FIG. 27 illustrates an example in which the circuit substrate 1608 is provided with a controlling circuit which controls driving of the light source 1607 and the controlling circuit and the light source 1607 are connected to each other via the FPC 1610. Note that the above-described controlling circuits may be formed over the liquid crystal panel 1601. In that case, the liquid crystal panel 1601 and the light source 1607 are connected to each other through an FPC or the like.

Note that although FIG. 27 illustrates an edge-light type light source where the light source 1607 is provided on the edge of the liquid crystal panel 1601, a direct type light source where the light sources 1607 are provided directly below the liquid crystal panel 1601 may be used.

This embodiment can be implemented in combination with any of the above embodiments as appropriate.

(Embodiment 9)

In this embodiment, a structure of a light-emitting device including the thin film transistor according to one embodiment of the present invention for a pixel is described. In this embodiment, a cross-sectional structure of a pixel in the case where a transistor for driving a light-emitting element is n-channel type is described with reference to FIGS. 26A to 26C. Note that, although FIGS. 26A to 26C shows the case where a first electrode is a cathode and a second electrode is an anode, the first electrode may be an anode and the second electrode may be a cathode as well.

Figure 26A:
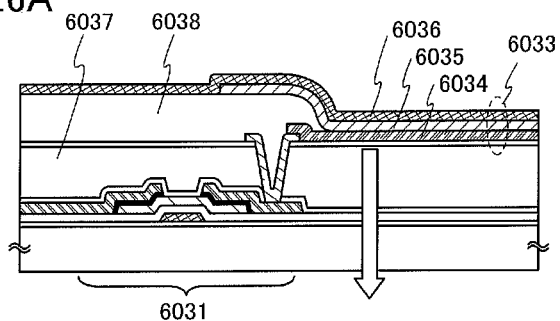
FIGS. 26A to 26C illustrate cross-sectional views of light-emitting devices.
Figure 26B:
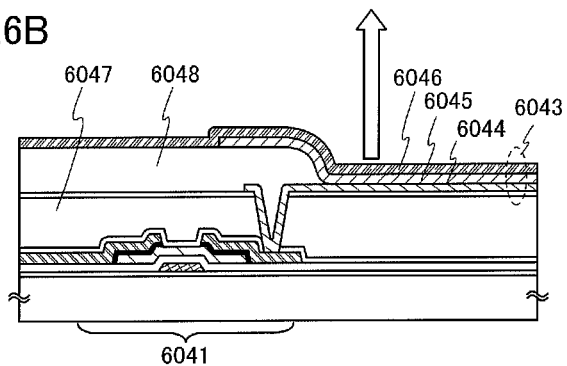
Figure 26C:
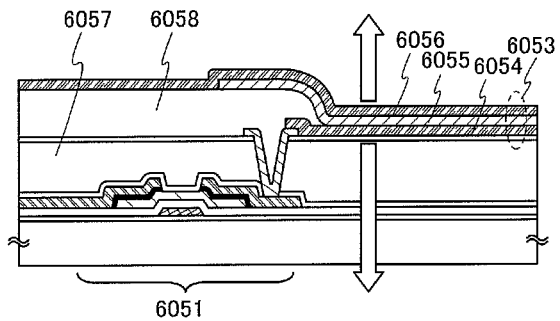

A cross-sectional view of a pixel in the case where a transistor 6031 is n-channel type, and light emitted from a light-emitting element 6033 is extracted from a first electrode 6034 side is illustrated in FIG. 26A. The transistor 6031 is covered with an insulating film 6037, and over the insulating film 6037, a bank 6038 having an opening is formed. In the opening of the bank 6038, the first electrode 6034 is partially exposed, and the first electrode 6034, an electroluminescent layer 6035, and a second electrode 6036 are sequentially stacked in the opening.

The first electrode 6034 is formed of a material or to a thickness to transmit light, and can be formed of a material having a low work function of a metal, an alloy, an electrically conductive compound, a mixture thereof, or the like. Specifically, an alkaline metal such as Li or Cs, an alkaline earth metal such as Mg, Ca, or Sr, an alloy containing such metals (e.g., Mg:Ag, Al:Li, or Mg:In), a compound of such materials (e.g., calcium fluoride or calcium nitride), or a rare-earth metal such as Yb or Er can be used. Further, in the case where an electron injection layer is provided, another conductive layer such as an aluminum layer may be used as well. Then, the first electrode 6034 is formed to a thickness to transmit light (preferably, about 5 nm to 30 nm). Furthermore, the sheet resistance of the first electrode 6034 may be suppressed by formation of a light-transmitting conductive layer of a light-transmitting oxide conductive material so as to be in contact with and over or under the above-described conductive layer with a thickness to transmit light. Alternatively, the first electrode 6034 may be formed of only a conductive layer of another light-transmitting oxide conductive material such as indium tin oxide (ITO), zinc oxide (ZnO), indium zinc oxide (IZO), or gallium-doped zinc oxide (GZO). Furthermore, a mixture in which zinc oxide (ZnO) is mixed at 2% to 20% in indium tin oxide including ITO and silicon oxide (hereinafter referred to as ITSO) or in indium oxide including silicon oxide may be used as well. In the case of using the light-transmitting oxide conductive material, it is preferable to provide an electron injection layer in the electroluminescent layer 6035.

The second electrode 6036 is formed of a material and to a thickness to reflect or shield light, and can be formed of a material suitable for being used as an anode. For example, a single-layer film including one or more of titanium nitride, zirconium nitride, titanium, tungsten, nickel, platinum, chromium, silver, aluminum, and the like, a stacked layer of a titanium nitride film and a film including aluminum as a main component, a three-layer structure of a titanium nitride film, a film including aluminum as a main component, and a titanium nitride film, or the like can be used for the second electrode 6036.

The electroluminescent layer 6035 is formed using a single layer or a plurality of layers. When the electroluminescent layer 6035 is formed with a plurality of layers, these layers can be classified into a hole injection layer, a hole transport layer, a light-emitting layer, an electron transport layer, an electron injection layer, and the like in view of the carrier transporting property. In the case where the electroluminescent layer 6035 includes at least one of the hole injection layer, the hole transport layer, the electron transport layer, and the electron injection layer in addition to the light-emitting layer, the electron injection layer, the electron transport layer, the light-emitting layer, the hole transport layer, and the hole injection layer are sequentially stacked over the first electrode 6034 in this order. Note that the boundary between each layer is not necessarily clear, and there may be a case where the boundary is unclear since a material for forming each layer is mixed with each other. Each layer can be formed with an organic material or an inorganic material. As the organic material, any of a high molecular compound, a medium molecular compound, and a low molecular compound can be used. Note that the medium molecular weight material corresponds to a low polymer in which the number of repetitions of a structural unit (the degree of polymerization) is about 2 to 20. A distinction between a hole injection layer and a hole transport layer is not always distinct, which is the same as in the sense that a hole transporting property (hole mobility) is an especially important characteristic. A layer being in contact with the anode is referred to as a hole injection layer and a layer being in contact with the hole injection layer is referred to as a hole transport layer for convenience. The same is also true for the electron transport layer and the electron injection layer; a layer being in contact with the cathode is referred to as an electron injection layer and a layer being in contact with the electron injection layer is referred to as an electron transport layer. In some cases, the light-emitting layer also functions as the electron transport layer, and it is therefore referred to as a light-emitting electron transport layer, too.

In the case of the pixel shown in FIG. 26A, light emitted from the light-emitting element 6033 can be extracted from the first electrode 6034 side as shown by a hollow arrow.

Next, a cross-sectional view of a pixel in the case where a transistor 6041 is n-channel type, and light emitted from a light-emitting element 6043 is extracted from a second electrode 6046 side is illustrated in FIG. 26B. The transistor 6041 is covered with an insulating film 6047, and over the insulating film 6047, a bank 6048 having an opening is formed. In the opening of the bank 6048, a first electrode 6044 is partially exposed, and the first electrode 6044, an electroluminescent layer 6045, and the second electrode 6046 are sequentially stacked in the opening.

The first electrode 6044 is formed of a material and to a thickness to reflect or shield light, and can be formed of a material having a low work function of a metal, an alloy, an electrically conductive compound, a mixture thereof, or the like. Specifically, an alkaline metal such as Li or Cs, an alkaline earth metal such as Mg, Ca, or Sr, an alloy containing such metals (e.g., Mg:Ag, Al:Li, or Mg:In), a compound of such materials (e.g., calcium fluoride or calcium nitride), or a rare-earth metal such as Yb or Er can be used. Further, in the case where an electron injection layer is provided, another conductive layer such as an aluminum layer may be used as well.

The second electrode 6046 is formed of a material or to a thickness to transmit light, and formed of a material suitable for being used as an anode. For example, another light-transmitting oxide conductive material such as indium tin oxide (ITO), zinc oxide (ZnO), indium zinc oxide (IZO), or gallium-doped zinc oxide (GZO) can be used for the second electrode 6046. Further, a mixture in which zinc oxide (ZnO) is mixed at 2% to 20% in indium tin oxide including ITO and silicon oxide (hereinafter referred to as ITSO) or in indium oxide including silicon oxide may be used as well for the second electrode 6046. Furthermore, a single-layer film including one or more of titanium nitride, zirconium nitride, titanium, tungsten, nickel, platinum, chromium, silver, aluminum, and the like, a stacked layer of a titanium nitride film and a film including aluminum as a main component, a three-layer structure of a titanium nitride film, a film including aluminum as a main component, and a titanium nitride film, or the like can be used for the second electrode 6046. However, in the case of using a material other than the light-transmitting oxide conductive material, the second electrode 6046 is formed to a thickness to transmit light (preferably, about 5 nm to 30 nm).

The electroluminescent layer 6045 can be formed in a manner similar to the electroluminescent layer 6035 of FIG. 26A.

In the case of the pixel shown in FIG. 26B, light emitted from the light-emitting element 6043 can be extracted from the second electrode 6046 as shown by a hollow arrow.

Next, a cross-sectional view of a pixel in the case where a transistor 6051 is n-channel type, and light emitted from a light-emitting element 6053 is extracted from a first electrode 6054 side and a second electrode 6056 side is illustrated in FIG. 26C.

The transistor 6051 is covered with an insulating film 6057, and over the insulating film 6057, a bank 6058 having an opening is formed. In the opening of the bank 6058, the first electrode 6054 is partially exposed, and the first electrode 6054, an electroluminescent layer 6055, and the second electrode 6056 are sequentially stacked in the opening.

The first electrode 6054 can be formed in a manner similar to that of the first electrode 6034 of FIG. 26A. The second electrode 6056 can be formed in a manner similar to the second electrode 6046 of FIG. 26B. The electroluminescent layer 6055 can be formed in the same manner as the electroluminescent layer 6035 in FIG. 26A.

In the case of the pixel shown in FIG. 26C, light emitted from the light-emitting element 6053 can be extracted from the first electrode 6054 side and the second electrode 6056 side as shown by hollow arrows.

This embodiment can be implemented in combination with any of the above embodiments as appropriate.

EXAMPLE 1

By using a semiconductor display device according to one embodiment of the present invention, an electronic device with high-speed operation can be provided. In addition, by using a semiconductor display device according to one embodiment of the present invention, an electronic device capable of displaying an image with high contrast and visibility can be provided.

Moreover, with the semiconductor device of the present invention, the heat treatment temperature in the manufacturing process can be suppressed; therefore, a highly reliable thin film transistor with excellent characteristics can be formed even when the transistor is formed over a substrate formed using a flexible synthetic resin of which heat resistance is lower than that of glass, such as plastic. Accordingly, with the use of the manufacturing method according to an embodiment of the present invention, a highly reliable, lightweight, and flexible semiconductor device with low power consumption can be provided. Examples of a plastic substrate include polyester typified by polyethylene terephthalate (PET), polyethersulfone (PES), polyethylene naphthalate (PEN), polycarbonate (PC), polyetheretherketone (PEEK), polysulfone (PSF), polyetherimide (PEI), polyarylate (PAR), polybutylene terephthalate (PBT), polyimide, acrylonitrile-butadiene-styrene resin, polyvinyl chloride, polypropylene, polyvinyl acetate, acrylic resin, and the like.

Semiconductor devices according to an embodiment of the present invention can be used for display devices, laptops, or image reproducing devices provided with recording media (typically, devices which reproduce the content of recording media such as digital versatile discs (DVDs) and have displays for displaying the reproduced images). Further, the electronic devices including the semiconductor device according to an embodiment of the present invention include mobile phones, portable game machines, portable information terminals, e-book readers, cameras such as video cameras or digital still cameras, goggle-type displays (head mounted displays), navigation systems, audio reproducing devices (for example, car audio systems or digital audio players), copying machines, facsimiles, printers, versatile printers, automated teller machines (ATMs), vending machines, and the like. Specific examples of such electronic devices are shown in FIGS. 28A to 28E.

Figure 28A:
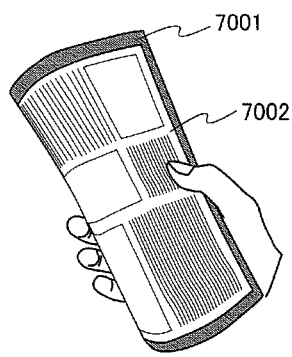
FIGS. 28A to 28E illustrate electronic devices each using a semiconductor display device.

FIG. 28A illustrates an e-book reader including a housing 7001, a display portion 7002, and the like. The semiconductor display device according to an embodiment of the present invention can be used for the display portion 7002. By including the semiconductor display device according to one embodiment of the present invention in the display portion 7002, an e-book reader capable of displaying an image with high contrast and visibility can be provided. The semiconductor device according to one embodiment of the present invention can also be used for an integrated circuit for controlling the driving of the e-book reader. By using the semiconductor device according to one embodiment of the present invention for the integrated circuit for controlling the driving of the e-book reader, an e-book reader capable of high-speed operation can be provided. Moreover, with the use of a flexible substrate, the semiconductor device and the semiconductor display device can have flexibility. Thus, a flexible, lightweight, and easy-to-use e-book reader can be provided.

Figure 28B:
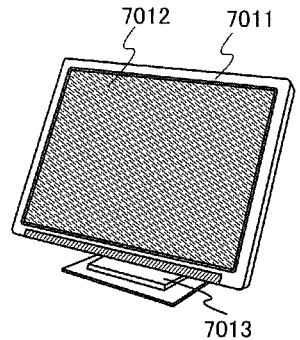

FIG. 28B illustrates a display device that includes a housing 7011, a display portion 7012, a support 7013, and the like. The semiconductor display device according to an embodiment of the present invention can be used for the display portion 7012. By including the semiconductor display device according to one embodiment of the present invention in the display portion 7012, a display device capable of displaying an image with high contrast and visibility can be provided. The semiconductor device according to one embodiment of the present invention can also be used for an integrated circuit for controlling the driving of the display device. By using the semiconductor device according to one embodiment of the present invention for the integrated circuit for controlling the driving of the display device, a display device capable of high-speed operation can be provided. Note that examples of the display device include all the information display devices used for personal computers, TV broadcast reception, advertisement display, or the like.

Figure 28C:
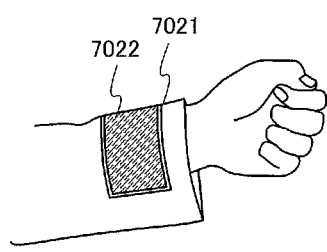

FIG. 28C illustrates a display device including a housing 7021, a display portion 7022, and the like. The semiconductor display device according to an embodiment of the present invention can be used for the display portion 7022. By including the semiconductor display device according to one embodiment of the present invention in the display portion 7022, a display device capable of displaying an image with high contrast and visibility can be provided. The semiconductor device according to one embodiment of the present invention can also be used for an integrated circuit for controlling the driving of the display device. By using the semiconductor device according to one embodiment of the present invention for the integrated circuit for controlling the driving of the display device, a display device capable of high-speed operation can be provided. Moreover, with the use of a flexible substrate, the semiconductor device and the semiconductor display device can have flexibility. Thus, a flexible, light-weight, and easy-to-use display device can be provided. Accordingly, as illustrated in FIG. 28C, a display device can be used while being fixed to fabric or the like, and an application range of the display device is dramatically widened.

Figure 28D:
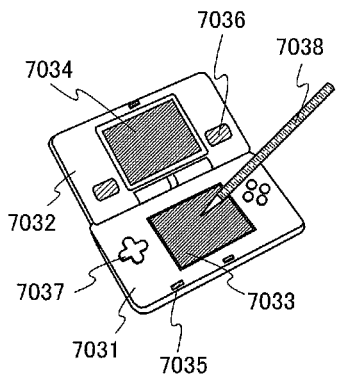

FIG. 28D illustrates a portable game machine including a housing 7031, a housing 7032, a display portion 7033, a display portion 7034, a microphone 7035, speakers 7036, operation keys 7037, a stylus 7038, and the like. The semiconductor display device according to an embodiment of the present invention can be used for the display portion 7033 and the display portion 7034. By including the semiconductor display device according to one embodiment of the present invention in the display portion 7033 and the display portion 7034, a portable game machine capable of displaying an image with high contrast and visibility can be provided. The semiconductor device according to one embodiment of the present invention can also be used for an integrated circuit for controlling the driving of the portable game machine. By using the semiconductor device according to one embodiment of the present invention for the integrated circuit for controlling the driving of the portable game machine, a portable game machine capable of high-speed operation can be provided. Although the portable game machine illustrated in FIG. 28D has the two display portions 7033 and 7034, the number of display portions included in the portable game machines is not limited thereto.

Figure 28E:
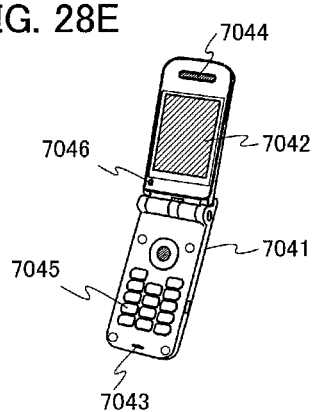

FIG. 28E illustrates a mobile phone which includes a housing 7041, a display portion 7042, an audio input portion 7043, an audio output portion 7044, operation keys 7045, a light-receiving portion 7046, and the like. Light received in the light-receiving portion 7046 is converted into electrical signals, whereby external images can be loaded. The semiconductor display device according to an embodiment of the present invention can be used for the display portion 7042. By including the semiconductor display device according to one embodiment of the present invention in the display portion 7042, a mobile phone capable of displaying an image with high contrast and visibility can be provided. The semiconductor device according to one embodiment of the present invention can also be used for an integrated circuit for controlling the driving of the mobile phone. By using the semiconductor device according to one embodiment of the present invention for the integrated circuit for controlling the driving of the mobile phone, a mobile phone capable of high-speed operation can be provided.

Example 1 can be implemented in combination with any of the above embodiments as appropriate.

This application is based on Japanese Patent Application serial no. 2009-235570 filed with Japan Patent Office on Oct. 9, 2009, the entire contents of which are hereby incorporated by reference.

EXPLANATION OF REFERENCE

10: pulse output circuit, 11: wiring, 12: wiring, 13: wiring, 14: wiring, 15: wiring, 21: input terminal, 22: input terminal, 23: input terminal, 24: input terminal, 25: input terminal, 26: output terminal, 27: output terminal, 31: transistor, 32: transistor, 33: transistor, 34: transistor, 35: transistor, 36: transistor, 37: transistor, 38: transistor, 39: transistor, 40: transistor, 41: transistor, 42: transistor, 43: transistor, 51: power supply line, 52: power supply line, 53: power supply line, 201: thin film transistor, 202: substrate, 203: gate electrode, 204: gate insulating film, 205: oxide semiconductor film, 206: source electrode, 207: drain electrode, 208: oxide insulating film, 209: conductive film, 210: insulating film, 211: thin film transistor, 212: substrate, 213: gate electrode, 214: gate insulating film, 215: oxide semiconductor film, 216: source electrode, 217: drain electrode, 218: oxide insulating film, 219: conductive film, 220: insulating film, 221: thin film transistor, 222: substrate, 223: gate electrode, 224: gate insulating film, 225: oxide semiconductor film, 226: source electrode, 227: drain electrode, 228: oxide insulating film, 229: conductive film, 230: insulating film, 231: channel protective film, 250: composite layer, 251: metal oxide film, 260: composite layer, 261: metal oxide film, 270: composite layer, 271: metal oxide film, 400: substrate, 401: gate electrode, 402: gate insulating film, 403: oxide semiconductor film, 404: oxide semiconductor film, 405: oxide semiconductor film, 406: conductive film, 408: capacitor wiring, 409: oxide semiconductor film, 411: oxide insulating film, 412: oxide semiconductor film, 413: thin film transistor, 414: pixel electrode, 415: transparent conductive film, 416: transparent conductive film, 420: terminal, 421: terminal, 430: composite layer, 431: metal oxide film, 700: pixel portion, 701: signal line driver circuit, 702: scan line driver circuit, 703: pixel, 704: transistor, 705: display element, 706: storage capacitor, 707: signal line, 708: scan line, 710: pixel electrode, 711: counter electrode, 712: microcapsule, 713: drain electrode, 714: resin, 1401: thin film transistor, 1402: gate electrode, 1403: gate insulating film, 1404: oxide semiconductor film, 1406: conductive film, 1407: oxide insulating film, 1408: insulating film, 1410: pixel electrode, 1411: alignment film, 1413: counter electrode, 1414: alignment film, 1415: liquid crystal, 1416: sealant, 1417: spacer, 1420: composite layer, 1421: metal oxide film, 1601: liquid crystal panel, 1602: diffusing plate, 1603: prism sheet, 1604: diffusing plate, 1605: light guide plate, 1606: reflection plate, 1607: light source, 1608: circuit substrate, 1609: FPC, 1610: FPC, 407a: source electrode, 407b: drain electrode, 5300: substrate, 5301: pixel portion, 5302: scan line driver circuit, 5303: scan line driver circuit, 5304: signal line driver circuit, 5305: timing control circuit, 5601: shift register, 5602: sampling circuit, 5603: transistor, 5604: wiring, 5605: wiring, 6031: transistor, 6033: light-emitting element, 6034: electrode, 6035: electroluminescent layer, 6036: electrode, 6037: insulating film, 6038: bank, 6041: transistor, 6043: light-emitting element, 6044: electrode, 6045: electroluminescent layer, 6046: electrode, 6047: insulating film, 6048: bank, 6051: transistor, 6053: light-emitting element, 6054: electrode, 6055: electroluminescent layer, 6056: electrode, 6057: insulating film, 6058: bank, 7001: housing, 7002: display portion, 7011: housing, 7012: display portion, 7013: support, 7021: housing, 7022: display portion, 7031: housing, 7032: housing, 7033: display portion, 7034: display portion, 7035: microphone, 7036: speaker, 7037: operation key, 7038: stylus, 7041: housing, 7042: display portion, 7043: audio input portion, 7044: audio output portion, 7045: operation key, 7046: light-receiving portion.

The invention claimed is:

1. A semiconductor device comprising:
a gate electrode over an insulating surface;
a gate insulating film over the gate electrode;
an oxide semiconductor film over the gate insulating film, the oxide semiconductor film overlapping the gate electrode;
a pair of metal oxide films over the oxide semiconductor film; and
a source electrode and a drain electrode over the pair of metal oxide films,
wherein the oxide semiconductor film comprises a first portion, a second portion and a third portion between the first portion and the second portion,
wherein the source electrode overlaps the first portion of the oxide semiconductor film,
wherein the drain electrode overlaps the second portion of the oxide semiconductor film,
wherein each of the first portion and the second portion of the oxide semiconductor film comprises, on the pair of metal oxide films sides, a region where a concentration of one or a plurality of metals in the oxide semiconductor film is higher than a concentration of one or a plurality of metals in the third portion of the oxide semiconductor film, and
wherein the pair of metal oxide films, the source electrode, and the drain electrode comprise a same metal material.

2. The semiconductor device according to claim 1, wherein the metal in the source electrode and the drain electrode is titanium, tungsten, or molybdenum.

3. The semiconductor device according to claim 1, wherein a thickness of the region of the oxide semiconductor film is more than or equal to 2 nm and less than or equal to 10 nm.

4. The semiconductor device according to claim 1, wherein a thickness of each of the pair of metal oxide films is more than or equal to 2 nm and less than or equal to 10 nm.

5. The semiconductor device according to claim 1, further comprising an insulating film over the source electrode and the drain electrode, wherein the insulating film is in direct contact with the oxide semiconductor film.

6. A semiconductor device comprising:
a gate electrode over an insulating surface;
a gate insulating film over the gate electrode;
an oxide semiconductor film including indium, gallium, and zinc over the gate insulating film, the oxide semiconductor film overlapping the gate electrode;
a pair of metal oxide films over the oxide semiconductor film; and
a source electrode and a drain electrode over the pair of metal oxide films,
wherein the oxide semiconductor film comprises a first portion, a second portion and a third portion between the first portion and the second portion,
wherein the source electrode overlaps the first portion of the oxide semiconductor film,
wherein the drain electrode overlaps the second portion of the oxide semiconductor film,
wherein each of the first portion and the second portion of the oxide semiconductor film comprises, on the pair of metal oxide films sides, a region where a concentration of one or a plurality of indium, gallium, and zinc is higher than a concentration of one or a plurality of indium, gallium, and zinc in the third portion of the oxide semiconductor film, and
wherein the pair of metal oxide films, the source electrode, and the drain electrode comprise a same metal material.

7. The semiconductor device according to claim 6, wherein the metal in the source electrode and the drain electrode is titanium, tungsten, or molybdenum.

8. The semiconductor device according to claim 6, wherein a thickness of the region of the oxide semiconductor film is more than or equal to 2 nm and less than or equal to 10 nm.

9. The semiconductor device according to claim 6, wherein a thickness of each of the pair of metal oxide films is more than or equal to 2 nm and less than or equal to 10 nm.

10. The semiconductor device according to claim 6, further comprising an insulating film over the source electrode and the drain electrode, wherein the insulating film is in direct contact with the oxide semiconductor film.

11. A semiconductor device comprising:
a gate electrode over a substrate;
a gate insulating film over the gate electrode;
an oxide semiconductor film comprising a first metal over the gate insulating film, the oxide semiconductor film overlapping the gate electrode;
a first metal oxide film over the oxide semiconductor film;
a second metal oxide film over the oxide semiconductor film;
a source electrode over the first metal oxide film; and
a drain electrode over the second metal oxide film;
wherein each of the first metal oxide film, the second metal oxide film, the source electrode and the drain electrode comprises a second metal,
wherein the oxide semiconductor film comprises a first portion, a second portion and a third portion between the first portion and the second portion,
wherein the source electrode overlaps the first portion of the oxide semiconductor film,
wherein the drain electrode overlaps the second portion of the oxide semiconductor film,
wherein a first region of the oxide semiconductor film is in direct contact with the first metal oxide film,
wherein a second region of the oxide semiconductor film is in direct contact with the second metal oxide film, and
wherein a concentration of the first metal in the first region and the second region is higher than a concentration of the first metal in the third portion.

12. The semiconductor device according to claim 11, wherein the second metal is titanium, tungsten, or molybdenum.

13. The semiconductor device according to claim 11, wherein a thickness of each of the first region and the second region is more than or equal to 2 nm and less than or equal to 10 nm.

14. The semiconductor device according to claim 11, wherein a thickness of each of the first metal oxide film and the second metal oxide film is more than or equal to 2 nm and less than or equal to 10 nm.

15. The semiconductor device according to claim 11, further comprising an insulating film over the source electrode and the drain electrode, wherein the insulating film is in direct contact with the oxide semiconductor film.

16. The semiconductor device according to claim 11,
wherein the source electrode is in direct contact with the gate insulating film, and
wherein the drain electrode is in direct contact with the gate insulating film.

17. A semiconductor device comprising:
a gate electrode over a substrate;
a gate insulating film over the gate electrode;
an oxide semiconductor film comprising a first metal over the gate insulating film, the oxide semiconductor film overlapping the gate electrode;
a first metal oxide film over the oxide semiconductor film;
a second metal oxide film over the oxide semiconductor film;
a source electrode over the first metal oxide film; and
a drain electrode over the second metal oxide film;
wherein each of the first metal oxide film, the second metal oxide film, the source electrode, and the drain electrode comprises a second metal,
wherein the oxide semiconductor film comprises a first portion, a second portion and a third portion between the first portion and the second portion,
wherein the source electrode overlaps the first portion of the oxide semiconductor film,
wherein the drain electrode overlaps the second portion of the oxide semiconductor film,
wherein a first region of the oxide semiconductor film is in direct contact with the first metal oxide film,
wherein a second region of the oxide semiconductor film is in direct contact with the second metal oxide film, and
wherein the first region and the second region have a higher indium concentration than the third portion.

18. The semiconductor device according to claim 17, wherein the second metal is titanium, tungsten, or molybdenum.

19. The semiconductor device according to claim 17, wherein a thickness of each of the first region and the second region is more than or equal to 2 nm and less than or equal to 10 nm.

20. The semiconductor device according to claim 17, wherein a thickness of each of the first metal oxide film and the second metal oxide film is more than or equal to 2 nm and less than or equal to 10 nm.

21. The semiconductor device according to claim 17, further comprising an insulating film over the source electrode and the drain electrode, wherein the insulating film is in direct contact with the oxide semiconductor film.

22. The semiconductor device according to claim 17,
wherein the source electrode is in direct contact with the gate insulating film, and
wherein the drain electrode is in direct contact with the gate insulating film.

* * * * *